(12) United States Patent
Alfieri

(10) Patent No.: US 8,943,448 B2
(45) Date of Patent: Jan. 27, 2015

(54) SYSTEM, METHOD, AND COMPUTER PROGRAM PRODUCT FOR PROVIDING A DEBUGGER USING A COMMON HARDWARE DATABASE

(71) Applicant: NVIDIA Corporation, Santa Clara, CA (US)

(72) Inventor: Robert Anthony Alfieri, Chapel Hill, NC (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 13/901,514

(22) Filed: May 23, 2013

(65) Prior Publication Data

US 2014/0351775 A1    Nov. 27, 2014

(51) Int. Cl.
    *G06F 17/50*    (2006.01)
(52) U.S. Cl.
    CPC .................................. *G06F 17/5022* (2013.01)
    USPC ............ 716/106; 716/101; 716/102; 716/103
(58) Field of Classification Search
    USPC ......................................... 716/101–103, 106
    See application file for complete search history.

(56) References Cited

U.S. PATENT DOCUMENTS

| | | | |
|---|---|---|---|
| 6,591,402 B1* | 7/2003 | Chandra et al. ............... | 716/106 |
| 7,143,373 B2* | 11/2006 | Moorby ........................ | 716/106 |
| 7,236,917 B1* | 6/2007 | Nouri et al. .................... | 703/14 |
| 7,363,610 B2 | 4/2008 | Alfieri | |
| 7,404,160 B2* | 7/2008 | Piper et al. .................... | 716/106 |
| 7,483,823 B2 | 1/2009 | Alfieri | |
| 7,509,647 B2* | 3/2009 | Donaldson et al. ........... | 718/106 |
| 7,536,288 B2* | 5/2009 | Nelson et al. .................. | 703/13 |
| 7,606,826 B2* | 10/2009 | Li et al. ............................. | 1/1 |
| 8,413,088 B1* | 4/2013 | Armbruster et al. .......... | 716/106 |
| 8,479,132 B2* | 7/2013 | Tsai et al. ...................... | 716/111 |
| 2002/0178285 A1* | 11/2002 | Donaldson et al. ........... | 709/237 |
| 2007/0294651 A1* | 12/2007 | Tsai et al. ......................... | 716/5 |
| 2012/0131309 A1* | 5/2012 | Johnson et al. .................. | 712/41 |
| 2013/0019216 A1* | 1/2013 | Vasudevan et al. ........... | 716/106 |

OTHER PUBLICATIONS

Alfieri, R. A., U.S. Appl. No. 13/901,516, filed May 23, 2013.

* cited by examiner

*Primary Examiner* — Naum B Levin
(74) *Attorney, Agent, or Firm* — Zilka-Kotab, PC

(57) ABSTRACT

A hardware model database is identified which stores a graph-based common representation of a hardware design that includes hardware module nodes each representative of a unique module of the hardware design and associated with one or more instances of the unique module. Additionally, a signal dump resulting from a simulation of a logic code model of the hardware design is identified. Each instance of each unique module is identified using the hardware model database, and for each assertion condition included therein, a corresponding value for the assertion condition is determined from the signal dump. Further, a construct of the hardware design corresponding to each instance of each unique module is conditionally displayed by a debugger application, based on the determined values of the corresponding assertion conditions included in the instance of the unique module.

21 Claims, 20 Drawing Sheets

SYSTEM, METHOD, AND COMPUTER PROGRAM PRODUCT FOR PROVIDING A DEBUGGER USING A COMMON HARDWARE DATABASE

FIELD OF THE INVENTION

The present invention relates to integrated circuit design.

BACKGROUND

Hardware design and verification are important aspects of the hardware creation process. For example, a hardware description language may be used to model and verify circuit designs. However, current techniques for designing hardware have been associated with various limitations.

For example, validation and verification may comprise a large portion of a hardware design schedule utilizing current hardware description languages. Additionally, data flow control and other protocol logic may not be addressed by current hardware description languages during the hardware design process. There is thus a need for addressing these and/or other issues associated with the prior art.

SUMMARY

A debugger system, method, and computer program product are provided which use a common hardware database. In use, a hardware model database is identified which stores a graph-based common representation of a hardware design, wherein the graph-based representation includes hardware module nodes each representative of a unique module of the hardware design and associated with one or more instances of the unique module. Additionally, a signal dump resulting from a simulation of a logic code model of the hardware design is identified. Each instance of each unique module is identified using the hardware model database, and for each assertion condition included therein, a corresponding value for the assertion condition is determined from the signal dump. Further, a construct of the hardware design corresponding to each instance of each unique module is conditionally displayed by a debugger application, based on the determined values of the corresponding assertion conditions included in the instance of the unique module.

DETAILED DESCRIPTION

In various embodiments, data flows and constructs that represent a hardware design including one or more circuits are specified. The data flows and constructs are analyzed by a hardware design application program that includes one or more components. The hardware design application program may analyze the data flows and constructs, identify errors, and/or generate a representation of the hardware design that is suitable for simulation and/or synthesis.

A first component of the design application program is a first translation component that is configured to translate a hardware language encoding of the data flows and constructs into a source database. A second component of the design application program is a second translation component that is configured to translate the source database into a common hardware database. A third component of the design application program is a third translation component that is configured to translate the common hardware database into a conventional hardware design language that is suitable for simulation and/or synthesis.

Figure 1A:
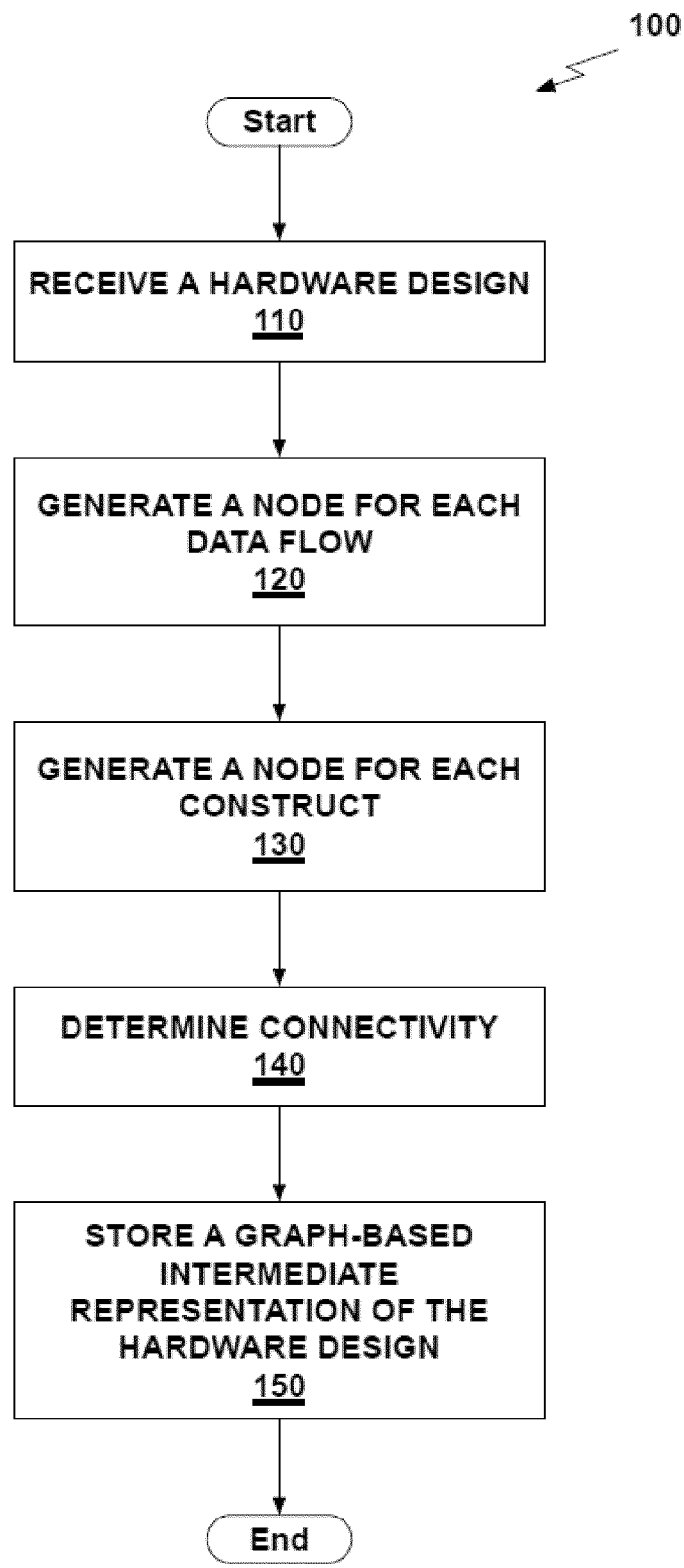
FIG. 1A shows a method for translating a hardware language into a source database, in accordance with one embodiment.

FIG. 1A shows a method 100 for translating a hardware language encoding of the data flows and constructs into a source database, in accordance with one embodiment. As shown in operation 110, a hardware design is received. The hardware design is encoded as one or more data flows (e.g., a representations of a flow of data through a hardware design, etc.) and one or more control constructs (e.g., constructions that may perform various common data steering and storage operations, etc.). As shown in operation 120, a node is generated for each data flow of the one or more data flows. As shown in operation 130, a node is generated for each control construct of the one or more control constructs. In one embodiment, the hardware design includes at least one compute construct and a node is also generated for the compute construct. As shown in operation 140, connectivity of the nodes generated by operations 120 and 130 is determined to generate a graph-based intermediate representation of the hardware design. As shown in operation 150, the graph-based intermediate representation of the hardware design is stored in a source database. A graph-based representation includes node components that are connected to form a graph. The node components may represent various types of data and may optionally include one or more pointers.

Figure 1B:
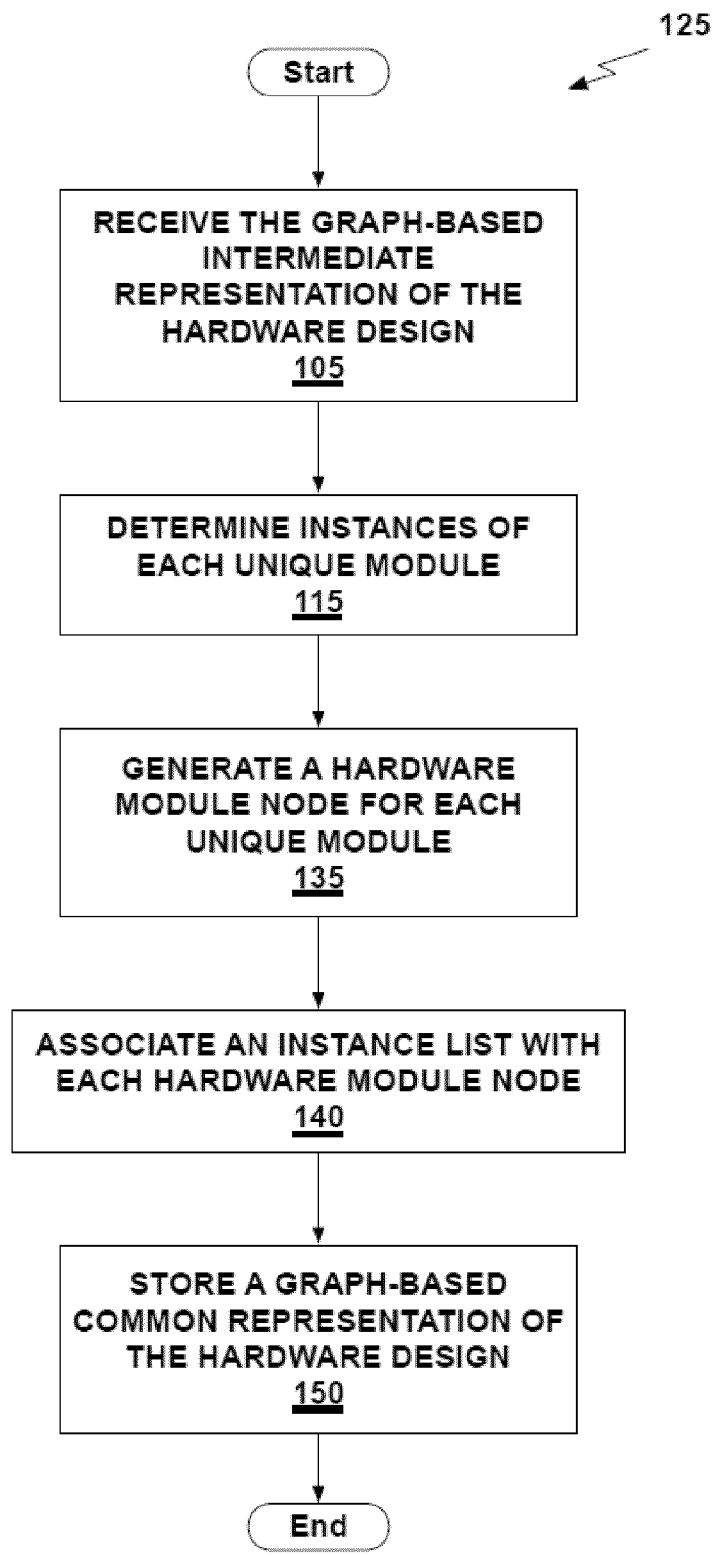
FIG. 1B shows a method for translating a source database into a common hardware database, in accordance with one embodiment.

FIG. 1B shows a method 125 for translating the source database into a common hardware database, in accordance with one embodiment. As shown in operation 105, the graph-based intermediate representation of a hardware design stored in the source database is received. The graph-based intermediate representation may include one or more graph nodes representing different modules (e.g., constructs or flows). As shown in operation 115, at least one instance of each unique module in the source database is determined. As shown in operation 135, a hardware module node is generated for each unique module, as further described in conjunction with FIGS. 3B and 4A. As shown in operation 140, a list of one or more instances is associated with each hardware module node. In one embodiment, each instance of the hardware module node that is generated for a unique module is represented in the list that is associated with the hardware module node. For example, in one embodiment, a name identifying each instance is included in the list along with a pointer to a node in the graph-based intermediate representation of the hardware design that corresponds to the instance. As shown in operation 150, a graph-based common representation of the hardware design that includes one or more generated hardware module nodes is stored.

The graph-based common representation of the hardware design includes hardware module nodes, each representing a type of logic. In one embodiment, the hardware module nodes are higher level than one would find in the intermediate language used by a typical synthesis tool such as Design Compiler® that has an intermediate language based on generic standard cells. The graph-based common representation of the hardware design is a target-independent representation that may be translated into Verilog® and similar register-transfer-level languages such as VHDL and System Verilog®.

Figure 1C:
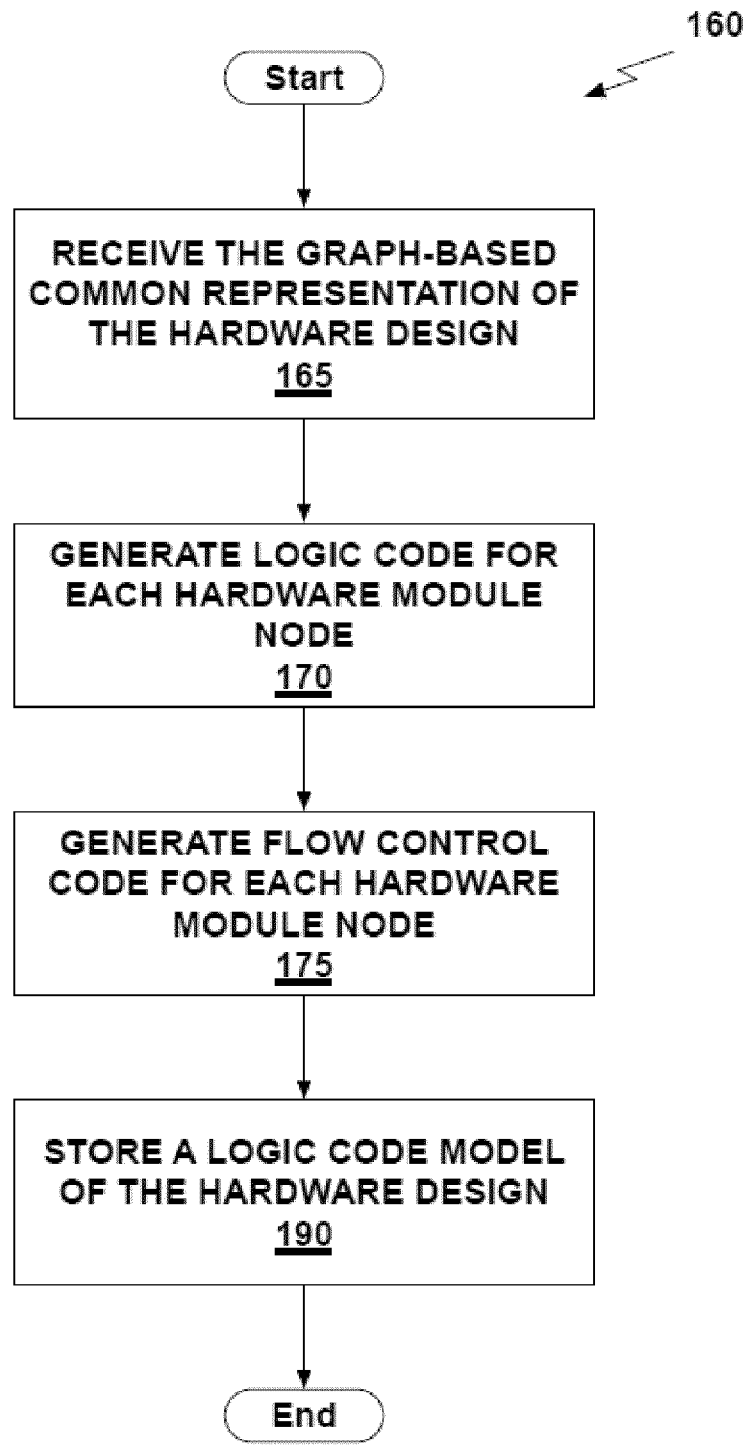
FIG. 1C shows a method for translating a common hardware database into a logic code model of a hardware design, in accordance with one embodiment.

FIG. 1C shows a method 160 for translating a common hardware database into a logic code model of a hardware design, in accordance with one embodiment. As shown in operation 165, the graph-based common representation of the hardware design stored in a common hardware database is received. As shown in operation 170, logic code for each hardware module node in the common hardware database is generated. As shown in operation 175, data flow control code for each hardware module node is also generated. The data flow control code may be specific for each input and output interface of a hardware module node. At operation 190, the logic code model of the hardware design is stored. The logic code model of the hardware design includes the generated logic code and the generated flow control code and may be synthesized and/or simulated.

In one embodiment, the hardware design may include one or more of the following: a circuit design, a behavioral simulation model, an estimated timing model, etc. For example, the hardware design may include an integrated circuit design, a digital circuit design, an analog circuit design, a mixed-signal circuit design, etc. In another embodiment, the hardware design may be created utilizing the hardware description language. For example, the hardware design may be created by initiating a new hardware design and saving the new hardware design that is encoded as data flows and constructs into a database, utilizing the hardware description language. In yet another embodiment, both the data flow and the construct may be included within the hardware design.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Hardware Design Environment Overview

Figure 2:
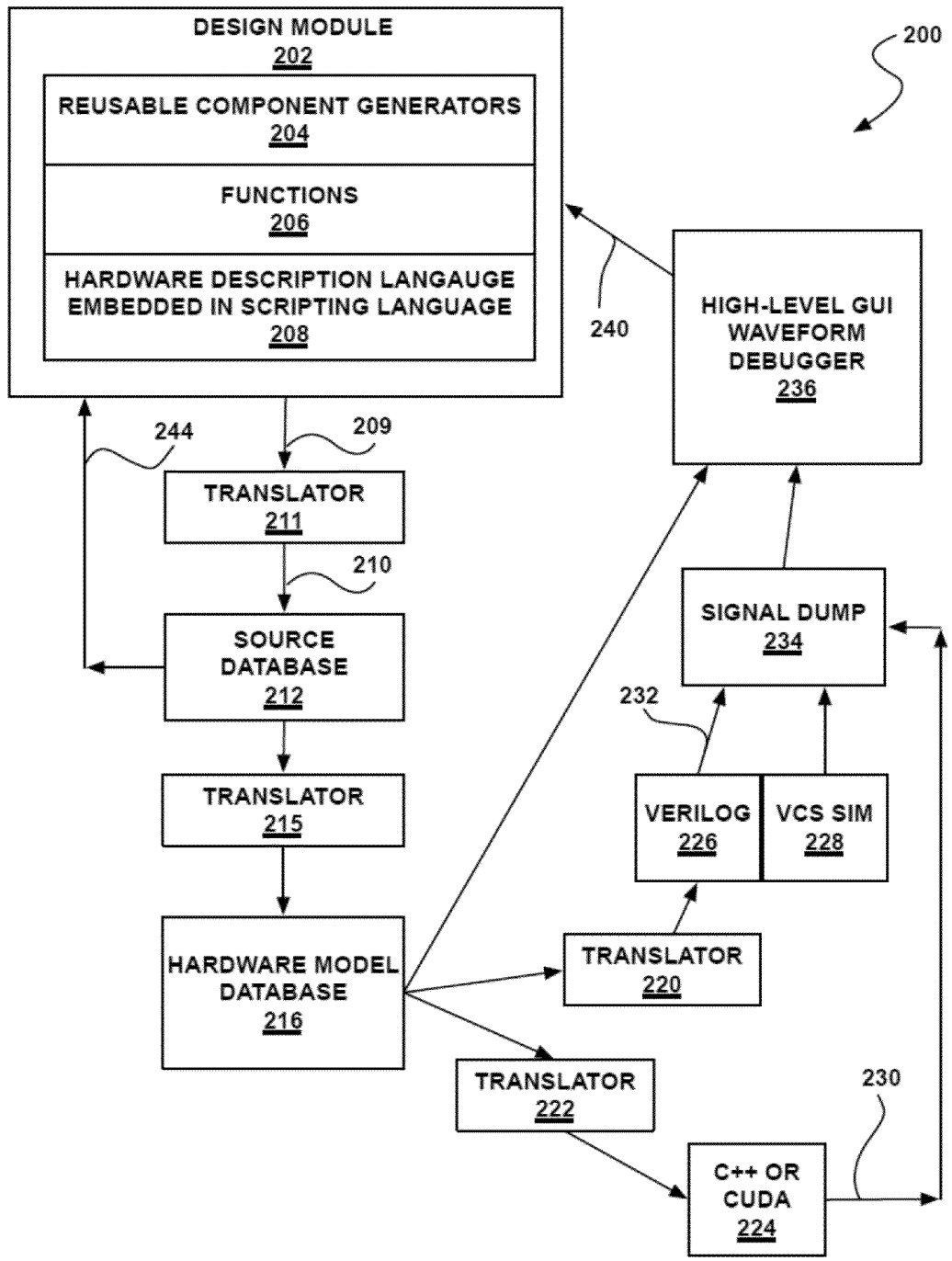
FIG. 2 shows an exemplary hardware design environment, in accordance with one embodiment.

FIG. 2 shows an exemplary hardware design environment 200, in accordance with one embodiment. As an option, the environment 200 may be carried out in the context of the functionality of FIGS. 1A, 1B, and 1C. Of course, however, the environment 200 may be implemented in any desired environment. It should also be noted that the aforementioned definitions may apply during the present description.

As shown, within a design module 202, reusable component generators 204, functions 206, and a hardware description language embedded in a scripting language 208 are all used to construct a design 209 that is translated by a first translator 211 and stored as a source database 212. The first translator 211 generates a graph-based intermediate representation of the design 210 that is stored as the source database 212. Also, any build errors within the design 209 that are identified during the first translation are corrected 244, and the design module 202 is updated. Additionally, a second translation is performed on the source database 212 by a second translator 215. The second translator 215 generates a hardware model database 216 that may be stored in a memory. The hardware model database 216 is independent of any particular target hardware design language.

Additionally, the hardware model database 216 is translated by a third translator 222 into C++, CUDA™ 224, or other data-parallel language such as OpenCL, translated by a fourth translator 220 into Verilog® 226, or the hardware model database 216 is sent directly to the high-level GUI (graphical user interface) waveform debugger 236. If the hardware model database 216 is translated into C++ or CUDA™ 224, the design represented in C++ or CUDA™ 230 is provided to a signal dump 234 and then to a high level debugger 236. If the hardware model database 216 is translated into Verilog® 226, the design represented in Verilog® 232 is provided to the signal dump 234 or a VCS simulation 228 is run on the design represented in Verilog® 232, which is then provided to the signal dump 234 and then to the high level GUI waveform debugger 236. Any logic bugs found using the high level GUI waveform debugger 236 can then be corrected 240 utilizing the design module 202.

Data Flows

A data flow may be constructed using the hardware description language embedded in a scripting language 208. The data flow may be based on one or more parameters, at least one of which may correspond to an interface protocol. In one embodiment, the interface protocol may include a communications protocol associated with a particular interface. In another embodiment, the communications protocol may include one or more formats for communicating data utilizing the interface, one or more rules for communicating data utilizing the interface, a syntax used when communicating data utilizing the interface, semantics used when communicating data utilizing the interface, synchronization methods used when communicating data utilizing the interface, etc.

Additionally, in one embodiment, one or more parameters may include an identification of an interface (e.g., an interface of a hardware design, etc.). In another embodiment, one or more parameters may include a width field associated with the interface. In yet another embodiment, one or more parameters may be received utilizing a hardware description language. For example, one or more parameters may be received utilizing the hardware description language embedded in a scripting language 208.

In one embodiment, the data flow (input or output) may represent a flow of data. For example, the data flow may represent a flow of data through a hardware design. In another embodiment, the data flow may include one or more groups of signals. For example, the data flow may include one or more groups of signals including implicit flow control signals that may operate according to the interface protocol. In yet another embodiment, the data flow may be associated with one or more interfaces. For example, the data flow may be associated with one or more interfaces of a hardware design corresponding to at least one of the received parameters. In another embodiment, the data flow may be constructed as a data type.

Also, in one embodiment, constructing the data flow as a data type may include implementing the data flow as an instance of a formal object class within a hardware description language. In another embodiment, the constructed data flow may include one or more fields with assigned values (e.g., one or more width fields each associated with an interface, etc.). In yet another embodiment, the constructed data flow may be viewed as a predetermined data structure (e.g., a hash, etc.) within the scripting language.

Further, in one embodiment, the data flow may have multiple levels of hierarchy. For example, the data flow may include a superflow that represents multiple flows of data and that is associated with a plurality of interfaces. In another embodiment, the superflow may act as an array within the scripting language. In yet another embodiment, the superflow may include one or more subfields with assigned values. In still another embodiment, the data flow may be included within the superflow (e.g., as a data flow within the hierarchy of the superflow, etc.).

Further still, in one embodiment, the data flow may have a numeric hierarchy. For example, all fields of a data flow may be numbered with successive whole integers, starting at zero. In another embodiment, the data flow may have an alphabetic hierarchy. For example, all fields of a data flow may be labeled with one or more identifiers (e.g., letters of the alphabet, underscores, decimal digits, etc.). In yet another embodiment, the data flow may have a custom naming hierarchy. For example, all fields of a data flow may be labeled with custom (e.g., user-provided, etc.) names.

Also, in one embodiment, the data flow may include a cloned data flow. For example, the data flow may be created by cloning another data flow, utilizing the hardware description language. In another embodiment, the data flow itself may be cloned to create another data flow. In yet another embodiment, the data flow may be an output data flow of a construct. In still another embodiment, the data flow may be located in a database.

An integrated circuit design is created, utilizing the hardware description language embedded in a scripting language 208. In one embodiment, the integrated circuit design may be saved to a memory or hard drive after the integrated circuit design is created. In another embodiment, the integrated circuit design may be created in the hardware description language. In yet another embodiment, the integrated circuit may be created utilizing a design create construct. Table 1 illustrates an exemplary design create construct that may be used within the scripting language to create an integrated circuit design, in accordance with one embodiment. Of course, it should be noted that the exemplary design create construct shown in Table 1 is set forth for illustrative purposes only, and thus should not be construed as limiting in any manner.

TABLE 1 aFlow->Design_Create( name => "NV_XX_yyy" );
...
aFlow->Design_Save( top => $topio );

Additionally, in one embodiment, one or more options may be associated with the creation of the integrated circuit design. Table 2 illustrates exemplary circuit design options, in accordance with one embodiment. Of course, it should be noted that the exemplary circuit design options shown in Table 2 are set forth for illustrative purposes only, and thus should not be construed as limiting in any manner.

TABLE 2

| Option | Type | Default | Description |
|---|---|---|---|
| name | id | required | name of top-level module for design |
| clks | array_of_clkspec | [{clk => "clk", reset_ => "reset_"}] | array of info about primary clk-rest pairs; clkspec is a hash with "clk" and "reset_" as required fields and currently there are no optional clkspec fields, but there will likely be others in the furture; the first clk name in the array becomes the default for created constructs |
| src-dirs | array_of_string | ["."] | array of directories Design_Inst( ) searches for source databases of instantiated designs; by default, we search only in the current directory; note that this has nothing to do with the directories Perl searches for .pm modules |

Further, one or more data flows are created in association with the integrated circuit design. In one embodiment, each of the one or more data flows may represent a flow of data through the integrated circuit design and may be implemented as instances of a data type utilizing a scripting language (e.g., Perl, etc.). For example, each data flow may be implemented in Perl as a formal object class. In another embodiment, one or more data flows may be associated with a single interface. In yet another embodiment, one or more data flows may be associated with multiple interfaces, and each of these data flows may be called superflows. For example, superflows may allow the passing of multiple interfaces utilizing one variable.

Further still, in one embodiment, each of the one or more data flows may have an arbitrary hierarchy. In another embodiment, each node in the hierarchy may have alphanumeric names or numeric names. In yet another embodiment, the creation of the one or more data flows may be tied into array and hash structures of the scripting language.

The scripting language provides built-in primitives and syntaxes for dynamic arrays (lists) and hashes. Arrays implement an ordered (numbered) list of values, but have no identifiers other than indexes. Hashes implement sets of named values, but have no order among the names. Hardware designs are typically constructed using both naming (of signals and units) and ordering of names.

To solve this problem, hierarchical data flows are implemented using name=>subflow pairs. In some scripting languages such as Perl, the '=>' operator is really just a comma (or can be preparsed into such), so an array initializer such as [a=>20, b=>30, c=>40] is equivalent to ["a", 20, "b", 30, "c", 40], where the values 20, 30, and 40 are bitwidths of the named data subflows a, b, and c, respectively. In other words, it is an array of (name, value) pairs. This syntax provides both non-numeric names as well as ordering of fields.

The aFlow class contains various types of constructors and shorthand notations for creating new, inactive data flows. For example, aFlow->Uint(20) returns a data flow that has no name but is 20 bits wide. Such a data flow is called a leaf data flow and a leaf flow may be 0 bits wide and will consume no area (having a value that is always 0). aFlow->Const(20) returns an aFlow that is wide enough to hold the value 20 (i.e., 5 bits) and records the constant value 20. Note that the value 0 consumes 0 bits. As a shorthand, the preparser, may be configured to allow a full set of Verilog® literals such as 32'hbabecafe. Verilog® literals may be automatically converted into constant data flows by a preparser before the scripting language sees them. For example, the preparser may convert the Verilog® literal 32'hbabecafe to aFlow->Const ("32'hbabecafe"). In general, the preparser converts syntax specific to the hardware description language into aFlow method calls. For example, because 'hdeadbeef syntax would confuse the preparser (single quote begins a character string in some languages), the user may use 0'hdeadbeef to indicate that the width of the literal (i.e., 32 bits) should be calculated.

aFlow->Hier( ) takes a list of name=>value pairs for the initial set of fields for the hierarchy flow. If the value is an integer (e.g., 20, 40, 60) then that value denotes a leaf flow of that bitwidth with the name pointing to that leaf. If the value is a Verilog® literal, then that field is a constant leaf. In one embodiment, the hardware description language does not allocate data flows and FIFO entries for parts of data flows that are constants.

aFlow->Hier( ) allows nested data structures, such as aFlow->Hier(a=>20, b=>[c=>40, d=>80], e=>8'h1f), which means that a is a leaf data flow, but b is a hierarchy data flow with leaf flows c and d. e is a constant data flow of given width and value. These shorthands translate into various aFlow constructor calls in the source database 212. In another embodiment, a hierarchical level may have all alphanumeric names or all numeric names. For example, if the names are numeric, they may be numbered with whole integers starting with zero.

In order to facilitate the creation of numerical hierarchy data flows where each subflow contains the same structure, one can use aFlow->Hier_N(10, name=>subflow, etc.) syntax which takes the number of subflows followed by the same type of arguments one would pass to aFlow->Hier( ). $Flow-> Clone( ) can be used to clone an existing data flow $Flow, even if the data flow is an active data flow (data flow activation is described further herein). The resulting data flow is always inactive. $Flow->Clone( ) clones the existing flow but converts all constant leaves into normal Uint( ) leaves of the same width.

Once a data flow is constructed using a data flow creation construct (e.g., Hier( ), Hier_N( ), Clone( ), etc.), the data flow appears thereafter as a hash. In one embodiment, the data flow appears as an anonymous hash in the Perl scripting language. Built-in hash operations may then be used to access and change the data flow or one of the subflows of the data flow. aFlow enables the accessing and editing of data flows by overriding the hash operators in the scripting language—in Perl, this is called a "tied hash".

Further, in one embodiment, a level in the hierarchy may be called the iflow level. For example, iflow may refer to an interface data flow. In another example, the iflow level may denote one interface, specifically the data for one cycle on the interface. In another embodiment, by default, a root of the data flow hierarchy may be the iflow level. In this way, each data flow may represent one interface by default. In yet another embodiment, flow control may be handled implicitly for each iflow.

Further still, in one embodiment, one or more of the data flows may include a superflow. For example, a superflow may include a data flow whose iflow level is lower than the top level. In this way, a superflow may have multiple iflows (each representing an interface with independent flow control) within it. In another embodiment, each of the one or more data flows may have an inactive or active status. For example, while a data flow is being constructed, it may be inactive. In another example, inactive data flows may be modified in any arbitrary way.

Also, in one embodiment, before a data flow can be passed to a construct, it may need to be made active (e.g., using a command such as Defer_Output( ), etc.). At that point, the data flow may not be modified directly by a user, but only indirectly by control and compute constructs. In another embodiment, Defer_Output( ) may have an option that lets a user select a level in the data flow as the iflow level. In yet another embodiment, by default, level 0 (top) may be the iflow level.

Table 3 illustrates exemplary data flow creation constructs within a scripting language, in accordance with one embodiment. Of course, it should be noted that the exemplary data flow creation constructs shown in Table 3 are set forth for illustrative purposes only, and thus should not be construed as limiting in any manner.

TABLE 3

| | |
|---|---|
| 1. | Hier( ) may create a named hierarchy of arbitrary structure |
| 2. | Hier_N( ) may create numeric hierarchies |
| 3. | Hier_Named_N( ) may create a named hierarchy with N fields with the same name prefix |

TABLE 3-continued

4. Hash manipulations are used to add and remove subflows from hierarchies
5. Uint( ) may create a simple leaf flow with no name
6. Const($val ) may create a leaf that has a constant value
7. Const_All_Ones( $width ) may create a leaf that has a constant value that is width $width and all 1s
8. Literals like 32'hdeadbeef may implicitly create constant values
9. Clone( ) may copy an active or inactive flow, and may always yield an inactive flow; all constant leaves may also be cloned
10. Clone(0) is like Clone( ) but may not clone constant leaves In one embodiment, once a data flow is marked as active, it may not be changed directly, instead the data flow may be changed by providing it as an input a construct. Additionally, in one embodiment, if a data flow is a primary input to the design, it may be passed to Design_Save( ) as part of the top I/O hash. In another embodiment, if the data flow is part of some kind of circular pipeline where the data flow goes into the top of the pipeline, then comes out the bottom later, a Connect operator may be used to connect the real output that comes out the bottom of the pipeline with the deferred output that is input to the top of the pipeline.

Control Constructs

In addition to data flows, a hardware design may also include constructs. In one embodiment, there may be two categories of constructs, control constructs and compute constructs. Control constructs, such as control constructs 305, 310, and 320 may perform various common data steering and storage operations, be implemented in the hardware design application program, and be inserted into a hardware design representation. Compute constructs, such as the compute construct 315 may provide a mechanism by which a designer can represent circuitry to perform user-defined operations. For example, in one embodiment, the function of a particular state machine may be encoded within a compute construct.

In one embodiment, the one or more control constructs may include an entity (e.g., a module, etc.) implemented as part of the hardware description language that receives one or more data flows as input. In another embodiment, the one or more control constructs may be located in a database. In yet another embodiment, the one or more control constructs may perform one or more operations based on the input data flow or flows. In still another embodiment, the one or more control constructs may be built into the hardware description language. In another example, the one or more control constructs may perform one or more data steering and storage operations, utilizing the constructed data flow as input.

Furthermore, in one embodiment, the one or more control constructs may each create one or more output data flows, based on one or more input data flows. In another embodiment, the one or more output data flows may be input into one or more additional constructs (e.g., control constructs, compute constructs, etc.). In yet another embodiment, the one or more control constructs may each include one or more parameters. For example, the one or more control constructs may each include a name parameter that may indicate a name for that construct. In another example, each of the one or more control constructs may include a comment parameter that may provide a textual comment that may appear in a debugger when debugging a design. In yet another example, each of the one or more control constructs may include a stallable parameter that may indicate whether automatic flow control is to be performed within that construct.

Further still, in one example, each of the one or more control constructs may include a parameter used to specify a depth of an output queue (e.g., a first in, first out (FIFO) queue, etc.) for each output data flow of that construct. In another example, each of the one or more control constructs may include a parameter that causes an output data flow of that construct to be registered out. In yet another example, each of the one or more control constructs may include a parameter that causes a ready signal of an output data flow of that construct to be registered in and an associated row of skid flip-flops to be added.

Also, in one embodiment, one or more of the control constructs may include a separate construct that creates multiple output data flows from a single input data flow. In another embodiment, one or more of the control constructs may include a merge construct that creates a single output data flow from multiple input data flows. In yet another embodiment, one or more of the control constructs may include a multicast construct that takes a single input data flow and sends it to one or more output data flows. In still another embodiment, one or more of the control constructs may include a select construct that accepts multiple input data flows and selects one of them to be an output data flow.

Additionally, in one embodiment, one or more of the control constructs may include a connect construct that connects an input data flow of the construct to a deferred output. A deferred output may include a primary input to the design or an input data flow that does not yet connect to an output data flow of another construct. In another embodiment, one or more of the control constructs may include an as construct that maps flow data to a different format. In yet another embodiment, one or more of the control constructs may include a shuffle construct that rearranges a structuring of input data flows. In still another embodiment, one or more of the control constructs may include a derive clock construct that creates a new clock from an existing clock.

Additionally, one or more control constructs are incorporated into the integrated circuit design in association with the one or more data flows. In one embodiment, the first translator 211 and/or second translator 215 are configured to check the connectivity of the one or more data flows and the one or more constructs. In another embodiment, bugs may be immediately found and the design script may be killed immediately upon finding an error. In this way, a user may avoid reviewing a large amount of propagated errors. In yet another embodiment, first translator 211 and/or second translator 215 may be configured to check that each input data flow of a construct is an output data flow from some other construct or is what is called a deferred output.

For example, a deferred output may include an indication that a data flow is a primary design input or a data flow will be connected later to the output of some future construct. In another embodiment, it may be confirmed that each input data flow is an input to no other constructs. In yet another embodiment, each construct may create one or more output data flows that may then become the inputs to other constructs. In this way, the concept of correctness-by-construction is promoted. In still another embodiment, the constructs are also superflow-aware. For example, some constructs may expect superflows, and others may perform an implicit 'for' loop on the superflow's subflows so that the user doesn't have to perform manipulate the subflows manually. For example, the data flow may include a superflow, and one or more of the control constructs may perform automatic looping on a plurality of subflows of the superflow, such that each subflow of the superflow is automatically analyzed within the one or more control constructs.

Furthermore, in one embodiment, a set of introspection methods may be provided that may allow user designs and generators to interrogate data flows. For example, the one or more control constructs may use these introspection functions to perform their work. More specifically, the introspection methods may enable obtaining a list of field names within a hierarchical data flow, widths of various subflows, etc. In another embodiment, in response to the introspection methods, values may be returned in forms that are easy to manipulate by the scripting language.

Also, in one embodiment, the one or more control constructs may each contain a plurality of common parameters. For example, the one or more control constructs may contain a "name" parameter that indicates a base module name that will be used for the construct and which shows up in the debugger. In another embodiment, the one or more control constructs may contain a "comment" parameter that provides a textual comment that shows up in the debugger. In yet another embodiment, the one or more control constructs may contain a "stallable" parameter that indicates whether automatic flow control is to be performed according to an interface protocol within the construct (e.g., whether input data flows are to be automatically stalled when outputs aren't ready, etc.). For example, if the "stallable" parameter is 0, the user may use various flow methods such as Valid( ) and Ready( ), as well as a Stall statement to perform manual flow control. In another example, additional flow controls such as vld/rdy_next and vld/credit may be used.

Additionally, in one embodiment, the one or more control constructs may contain an out_fifo parameter that allows the user to specify a depth of the output FIFO for each output data flow. For example, when multiple output data flows are present, the user may supply one depth that is used by all, or an array of per-output-flow depths. In another embodiment, the one or more control constructs may contain an out_reg parameter that causes the output data flow to be registered out. For example, the out_reg parameter may take a 0 or 1 value or an array of such like out_fifo. In yet another embodiment, the one or more control constructs may contain an in_reg parameter that causes the input data flow to be registered in. In still another embodiment, the one or more control constructs may contain an in_fifo parameter that allows the user to specify a depth of the input FIFO for each input data flow. Further, in one embodiment, the one or more control constructs may contain an out_rdy_reg parameter that causes the output data flow's implicit ready signal to be registered in. In another embodiment, out_fifo, out_reg, and out_rdy_reg may be mutually exclusive and may be used in any combination.

The "stallable", out_reg, out_fifo, and out_rdy_reg parameters specify how the interface protocol is implemented. An interface protocol defines a characteristic of an input or output data flow that is represented in a simulation model and a synthesized circuit created from the hardware design representation. For example, circuitry is automatically inserted into a representation of the hardware design based on the interface protocol. The automatic insertion reduces the amount of work needed to enter a design by a user and presumably also ensures that the interface protocol operation has been thoroughly verified. Furthermore, the hardware design application components, such as the first translator 211 and the second translator 215 may perform various checks to identify errors when data flows having incompatible interface protocols are connected. Errors may also be identified during simulation by the automatically inserted representations.

Further still, in one embodiment, clocking and clock gating may be handled implicitly. For example, there may be three levels of clock gating that may be generated automatically: fine-grain clock gating (FGCG), second-level module clock gating (SLCG), and block-level design clock gating (BLCG). In another embodiment, FGCG may be handled by synthesis tools. In yet another embodiment, a per-construct (i.e., per-module) status may be maintained. In still another embodiment, when the status is IDLE or STALLED, all the flops and rams in that module may be gated. In another embodiment, the statuses from all the constructs may be combined to form the design-level status that is used for the BLCG. This may be performed automatically, though the user may override the status value for any Compute( ) construct using the Status <value> statement.

Also, in one embodiment, the one or more control constructs may include a Separate( ) construct. For example, the Separate( ) construct may take an input data flow and provide ways of peeling off various fields from that data flow (e.g., by splitting a data flow into multiple output data flows and returning the output data flows, etc.). In another example, a user can create as many data flows as needed from a single input data flow. In another embodiment, regular expressions may be used to concisely describe the set of fields to be retained for each output data flow. If the input data flow is a superflow (multiple interface data flows), the Separate( ) construct may implicitly perform the same operation on the interface data flows in parallel. The output of the Separate( ) construct may be a list of data flows or a superflow containing them. In yet another embodiment, there may be options that allow levels of hierarchy to be automatically collapsed in the process. If the chosen fields have numeric names, they may be renumbered automatically (e.g., so they follow 0, 1, 2, etc.).

Further, in one embodiment, the Separate( ) construct may split the input data flow in one or more ways. For example, the Separate( ) construct may supply a list of fields to be kept for each output data flow. The list may contain regular expressions. In another example, the Separate( ) construct may supply a count of the number of fields to be kept for each output data flow. In yet another example, the Separate( ) construct may duplicate the input data flow N times, producing N+1 output data flows. The control construct may be a separate( ) construct that receives an input data flow and splits the input data flow into an output data flow and an output data flow.

Table 4 illustrates the options associated with a Separate( ) construct, in accordance with one embodiment. Of course, it should be noted that the options shown in Table 4 are set forth for illustrative purposes only, and thus should not be construed as limiting in any manner.

TABLE 4

| Option | Type | Default | Description |
| --- | --- | --- | --- |
| name | id | required | name of generated module |
| comment | string | undef | optional comment to display in the debugger (highly recommended) |
| keep | array_of_namelist | one of these 3 is required | array of strings each of which is a list of names to keep for that output flow |

TABLE 4-continued

| Option | Type | Default | Description |
|---|---|---|---|
| keep_count | array_of_int | one of these 3 is required | array of counts each of which is the number of subflows to keep for that output flow |
| duplicate | int | one of these 3 is required | number of times to simply duplicate the input flow (this count +1 are returned) |
| level | string | iflow | level at which to perform separate |
| remove_hier | array_of_int | [0, 0, . . .] | array of boolean flags each of which indicates whether a level of hierarchy is to be removed for that output flow |
| clk | id | global default | clock to use for this construct |
| stallable | int | global default | whether the construct is stallable |
| out_reg | array_of_int | [global default, . . .] | array of 0 or 1 indicating whether the corresponding output iflow is registered out |
| out_separate | int | [1] | indicates that the output is a separate list of flows (default value value of 1) or a superflow (0) |
| out_rdy_reg | array_of_int | [global default, . . .] | array of 0 or 1 indicating whether the corresponding output iflow's rdy signal is registered in; causes a skid flop to be added even if out_reg = 0. |
| out_fifo | array_of_fifospec | [0 ,0, . . .] | array of fifo specs, which are currently limited top a simple int representing depth of the fifo for the corresponding output iflow; out_reg and out_rdy_reg flops are after the fifo |

Further still, in one embodiment, if the stallable option is 1, then the input may be stalled until data can be advanced on all outputs. In another embodiment, the input may not be transferred to any output until all outputs can accept it. In yet another embodiment, if the stallable option is 0, a simulation-time check may be generated by the second translator 215 or the third translator 220 such that the input may always be transferred to all outputs whenever valid input is available.

The keep option allows for explicit naming of the subflows that are kept for each output data flow. In one embodiment, each name list may be enclosed in double quotes. In another embodiment, each name may be an identifier or a regular expression. In still another embodiment, unused input subflows may be dropped. The duplicate option may provide a quick way to completely duplicate the input data flow. In another embodiment, the count may be one less than the number of copies returned.

The keep_count option may split a numerical hierarchical into multiples where each output data flow contains some count of the next input subflows. In one embodiment, the chosen subflows may be renumbered in the second, third, etc. output data flows. In another embodiment, not all input subflows may need to be consumed.

The remove_hier option may allow for the removal of a level of a hierarchy for each output data flow. Additionally, the out_reg option may indicate that a particular output is to be registered (i.e., output via flip-flops).

Additionally, in one embodiment, the one or more control constructs may include a Merge( ) construct. For example, the Merge( ) construct may be the inverse of the Separate( ) construct. In another embodiment, the Merge( ) construct may take multiple input data flows (e.g., in list form, superflow form, etc.) and may merge the corresponding fields into the same data flow. In yet another embodiment, when fields are names, they may not conflict in name. In still another embodiment, when fields are numbered, they may conflict so they may be renumbered. In another embodiment, all other features of the Separate( ) construct may be supported. The control construct may be a merge( ) construct that receives input data flows and merges the input data flows into an output data flow.

Table 5 illustrates the options associated with a Merge( ) construct, in accordance with one embodiment. Of course, it should be noted that the options shown in Table 5 are set forth for illustrative purposes only, and thus should not be construed as limiting in any manner.

TABLE 5

| Option | Type | Default | Description |
|---|---|---|---|
| name | id | required | name of generated module |
| comment | string | undef | optional comment to display in the debugger (highly recommended) |
| Others | array_of_flow | required | array of other flows to be merged |
| level | string | iflow | level at which to perform the merge |
| add_hier | 0 or 1 | 0 | indicates whether to add a level of hierarchy to each input (at level) before doing the merge |
| clk | id | global default | clock to use for this construct |
| stallable | 0 or 1 | global default | whether the construct is stallable |
| out_reg | 0 or 1 | global default | 0 or 1 indicating whether the output iflow is registered out |
| out_rdy_reg | 0 or 1 | global default | 0 or 1 indicating whether the output iflow's rdy signal is registered in; causes a skid flop to be added even if out_reg = 0. |
| out_fifo | fifospec | 0 | a fifospec which is currently limited to a simple int representing depth of the fifo for the output iflow; out_reg and out_rdy_reg flops are after the fifo |

In one embodiment, the Merge( ) construct may take multiple input data flows and merge them into one output data flow. In another embodiment, if the stallable option is 1, then inputs may be stalled until all arrive and an output cycle can be advanced. In another embodiment, if the stallable option is 0, then all input data flows may be valid in the same cycle because there may be no way to stall any inputs. This may be checked at simulation time.

Further, in one embodiment, the one or more control constructs may include a Multicast( ) construct. For example, the Multicast( ) construct may take a single data flow input and send it to one or more output data flows. In another embodiment, there may be various ways to specify the mask of outputs to receive the input, including embedding the mask in the input data flow or providing a separate Unicast/Destmask input data flow. In yet another embodiment, the Multicast( ) construct may implicitly work in parallel on input data flows that are superflows, and produce corresponding superflows. In still another embodiment, automatic data flow control may be provided if stallable is 1.

Table 6 illustrates the options associated with a Multicast ( ) construct, in accordance with one embodiment. Of course, it should be noted that the options shown in Table 6 are set forth for illustrative purposes only, and thus should not be construed as limiting in any manner.

TABLE 6

| Option | Type | Default | Description |
|---|---|---|---|
| name | id | required | name of generated module |
| comment | string | undef | optional comment to display in debugger (highly recommended) |
| count | int | required | number of output iflows per input iflow |
| broadcast | int | 1 of these 6 is required | broadcast to all <count> output iflows |
| Unicast_Dest_Flow | flow | 1 of these 6 is required | send to one output; the unicast flow must have one field of width log2(count) |
| unicast_dest_field | id | 1 of these 6 is required | send to one output; the destination is a separate field in the input with this name |
| Destmask_Flow | flow | 1 of these 6 is required | send to zero or more outputs; the destination mask must have one field of width <count> |
| destmask_field | id | 1 of these 6 is required | send to zero or more outputs; the destination mask is a separate field in the input with this name |
| destmask_code | code | 1 of these 6 is required | send to zero or more outputs; the destination mask is computed combinatorially by a user-supplied code block; the code block receives the input iflow and the output destmask flow as parameters from Multicast( ) |
| unicst_dest_field_drop | 0 or 1 | 0 | when unicast_dest_field is given, indicates whether to drop the field in the output iflows |
| destmask_field_drop | 0 or 1 | 0 | when destmask_field is given, indicates whether to drop the field in the output iflows |
| clk | id | global default | clock to use for this construct |
| stallable | 0 or 1 | global default | whether the construct is stallable |
| out_reg | array_of_int | [global default, . . . ] | array of 0 or 1 indicating whether the corresponding output iflow is registered out |
| out_rdy_reg | array_of_int | [global default, . . . ] | array of 0 or 1 indicating whether the corresponding output iflow's rdy signal is residtered in; causes a skid flop to be added even if out_reg = 0. |
| out_fifo | array_of_fifospec | [0, 0, . . . ] | array of fifo specs, which are currently limited to a simple int representing depth of the fifo for the corresponding output iflow; out_reg and out_rdy_reg flops are after the fifo |
| out_separate | int | 0 | indicates whether to return a list of flows or return one superflow (default) |

In one embodiment, the Multicast( ) construct may take one input iflow and sends it to one or more output iflows. Table 7 illustrates various options for redirecting an input data flow using the Multicast ( ) construct, in accordance with one embodiment. Of course, it should be noted that the options shown in Table 7 are set forth for illustrative purposes only, and thus should not be construed as limiting in any manner.

TABLE 7

1. Use the broadcast => 1 option to send it always to all outputs
2. Use the Unicast_Dest_Flow option to have a side flow indicate the single output that should receive the input
3. Use the Destmask_Flow option to have a side flow that contains a bitmask indicating some arbitrary number of zero or more outputs to receive the input
4. Use the unicast_dest_field option to indicate that the unicast destination is embedded in the input as a separate field
5. Use the destmask_field option to indicate that the destmask is embedded in the input as a separate field
6. Use the destmask_code option that allows you to write arbitrary code to compute the destination using any combination of input fields Additionally, in one embodiment, the multicast may always occur at the iflow level. In another embodiment, if stallable is 1, then the input iflow may be stalled until all destined output iflows are unstalled. No outputs may receive the input until all of them are unstalled. In yet another embodiment, if stallable is 0, then the input iflow and the Unicast_Dest_Flow/Destmask_Flow iflow may be valid in the same clock cycle because there may be no way to stall any inputs. This may be checked at simulation time. In still another embodiment, the Multicast( ) construct may not return a list of data flows. Instead, it may returns a superflow containing all the output iflows. The out_separate=>1 option may be used to have the Multicast( ) construct return a list.

The destmask may be embedded in the input data flow as the "destmask" field. The destmask_field_drop option may be used to drop the destmask from the output iflows. The destmask_code option may allow for the supplying of a code block to perform a computation of a destmask from various fields in the input, where such computations are performed combinatorially. For example, destmask may be set to all 0's if "a" is 0; otherwise it may be set to the lower 3 bits of "b." In another embodiment, the code block may work similarly to Compute( ) code blocks. For example, the input iflow may be passed by Multicast( ) as the first argument. The second argument is the data flow holding "destmask" which may be assigned by the code block. If the input data flow has multiple iflows, the code block may get called for each input iflow, thus producing a separate destmask for each input iflow. In one embodiment, a Shuffle( ) construct may be used to rearrange the output iflows.

Further still, in one embodiment, the one or more control constructs may include a Select( ) construct. For example, the Select( ) construct may be the inverse of Multicast( ) and may perform arbitration. In another embodiment, the Select( ) construct may take a list of data flows or a superflow where all interface data flows have the same structure, and may choose one interface data flow for its output. For example, one arbitration algorithm may be round-robin (RR), but any type arbiter may be supported, including priority-based, least recently used (LRU), weighted-RR, etc. In another embodiment, the arbiters may be implemented separately and may be registered, then referred to by name in the Select( ) construct. Further, in yet another embodiment, a user may specify arbitration code, or may supply the arbitration decision as a separate input data flow. Like Multicast( ), the input data flows may be superflows, and the Select( ) construct may be applied in parallel and may produce an output superflow containing the answers. Further, data flow control may be automatically managed by default.

Table 8 illustrates the options associated with a Select( ) construct, in accordance with one embodiment. Of course, it should be noted that the options shown in Table 8 are set forth for illustrative purposes only, and thus should not be construed as limiting in any manner.

TABLE 8

| Option | Type | Default | Description |
|---|---|---|---|
| name | id | required | name of generated module |
| comment | string | undef | optional comment to display in the debugger (highly recommended) |
| arb | string | rr | arbitration algorithm if there is no Arb_Flow. rr is a simple round-robin algorithm without priorities and is the default. sp is a simple priority-based algorithm where iflow 0 has highest priority always, iflow 1 has next-highest priority always, etc. |
| Arb_Flow | flow | undef | separate arbitration flow; each arb iflow must have one field (any name) of width log2 (input_iflow_count) |
| keep_hier | 0 or 1 | 0 | indicates that the output iflow will have a dummy "0" node added above it |
| raise_iflow | 0 or 1 | 0 | when keep_hier => 1 is specified, indicates that the output iflow level will be above the dummy "0" node |
| out_src_name | string | undef | if specified, each output iflow will contain a field with this name that holds the index of the selected input iflow |
| clk | id | global default | clock to use for this construct |
| stallable | 0 or 1 | global default | whether the construct is stallable |
| out_reg | 0 or 1 | global default | 0 or 1 indicating whether the output iflow is registered out |
| out_rdy_reg | 0 or 1 | global default | 0 or 1 indicating whether the output iflow's rdy signal is registered in; causes a skid flop to be added even if out_reg = 0. |
| out_fifo | fifospec | 0 | a fifospec which is currently limited to a simple int representing depth of the fifo for the output iflow; out_reg and out_rdy_reg flops are after the fifo |

In one embodiment, the Select( ) construct may be the inverse of the Multicast( ) construct. The Select( ) construct may choose one iflow from multiple input iflows. For example, the Select( ) construct may act as an arbiter. In another embodiment, the Select( ) construct may perform a round-robin arbitration. In yet another embodiment, the Select( ) construct may allow for a user to supply an arbitration decision.

Additionally, in one embodiment, the Select( ) construct may occur at the level above the iflow level, (e.g., called the parent of the iflow level, etc.). In another embodiment, the parent may have numerically named children iflows 0, 1, etc. In yet another embodiment, if there are multiple parents, then an output iflow may be created for each parent's arbitration. Note that the Separate( ) and Merge( ) constructs can also operate above the iflow level, in which case, they are just wires. The Multicast( ) construct can work above the iflow level, so operations occur in parallel like Select( ).

Further, in one embodiment, if the stallable option is 1, then inputs may be stalled if the output is stalled. Also, if an Arb_Flow is supplied, then the Arb_Flow and the chosen input data flow may both arrive before either can be retired. Unchosen input iflows may be stalled. In another embodiment, if the stallable option is 0, an Arb_Flow may be used as an assertion check that the proper input flow is valid. That input may always be chosen. The output iflow may not be stalling when a chosen iflow is attempted to be transferred to it.

Further still, in one embodiment, the Select( ) construct may take in a superflow rather than a list of data flows. In another embodiment, an 'arb_code' option may exist that may allow a user to supply a code block including an arbiter. There may also be an aFlow method to register an arbiter code block by name so that other designers may use them easily (e.g., arb=>"name", etc.). In this way, the system itself may not need to implement any arbiter.

Also, in one embodiment, the one or more control constructs may include a Connect( ) construct. For example, a deferred input may not be a primary input. Instead, the deferred input may be part of a circular design. For example, it may go into the top of a contrived pipeline, then come out the bottom. The Connect( ) construct may be used to connect the bottom to the deferred data flow at the top. In this way, the data flows may become the same, thus completing the circle.

In addition, in one embodiment, the one or more control constructs may include an As( ) construct. For example, the As( ) construct may be used to map iflow data to a completely different packet format. The As( ) construct may be used both inside and outside of a code block. In another embodiment, a user may pass a width to get a simple flattened Uint( ) leaf result, or the user may pass anything that can be passed to aFlow->Clone( ), including a name=>width list as shown above, or another active or inactive data flow to use as a template.

Furthermore, in one embodiment, $Flow->As_Bits( ) may include shorthand for $Flow->As($Flow->width( )). It may flatten out $Flow to the same number of raw bits. In another embodiment, if the input data flow has multiple iflows, then the template may be applied to each iflow. In yet another embodiment, the As( ) construct may not be used to modify data flows above the iflow level. Note that inside a code block, the input data flow may not denote multiple iflows. In still another embodiment, if the template is larger than the input iflow, then the result may be zero-extended, and if the template is smaller than the input iflow, then the result may be truncated. In another embodiment, after this operation is performed, the template may not be modified in any way.

Further, in one embodiment, the one or more control constructs may include a Shuffle( ) construct. For example, the Shuffle( ) construct may be used to rearrange data flows above the iflow level. This may result in pure wiring and no logic. In another embodiment, constructs such as Shuffle( ), Select( ), and Multicast( ) may be used to manipulate data flows above the iflow level. In still another embodiment, the Shuffle( ) construct may support a transpose operation.

Table 9 illustrates the options associated with a Shuffle( ) construct, in accordance with one embodiment. Of course, it should be noted that the options shown in Table 9 are set forth for illustrative purposes only, and thus should not be construed as limiting in any manner.

TABLE 9

| Option | Type | Default | Description |
| --- | --- | --- | --- |
| name | id | required | name of generated module |
| comment | string | undef | optional comment to display in the debugger (highly recommended) |
| op | string | transpose | the type of shuffle operation; only transpose is supported, so there is no point in ever supplying this option |
| level | string | iflow | child level at which to perform shuffle; there must be two levels available above this level |
| clk | id | global default | clock to use for this construct |

The inputs of a crossbar switch may be shuffled to the outputs of the switch. For example, the data flow may have at least two levels above the iflow level. In another example, a grandfather level may be at the top, with a parent level at level 1, and an iflow level at level 0. There may be 5 parents, each with 2 child iflows. After transposing via a Shuffle( ) construct, the output data flow may have 2 parents, each with 5 child iflows, one taken from each of the input parents. In this way, output parent 0 may have child iflow 0 from each of the 5 input parents, and output parent 1 may have child iflow 1 from each of the 5 input parents.

Further still, in one embodiment, the one or more control constructs may include a Derive_Clock( ) construct. For example, the Derive_Clock( ) construct may be used to create a new clock from an existing clock from_clk "clk". In another embodiment, Disable_Flow may disable the new clock when Disable_Flow( )->Valid( ).

Table 10 illustrates the options associated with a Derive_Clock( ) construct, in accordance with one embodiment. Of course, it should be noted that the options shown in Table 10 are set forth for illustrative purposes only, and thus should not be construed as limiting in any manner.

TABLE 10

| Option | Type | Default | Description |
| --- | --- | --- | --- |
| name | id | required | name of new clock |
| comment | string | undef | optional comment to display in the debugger (highly recommended) |

TABLE 10-continued

| Option | Type | Default | Description |
| --- | --- | --- | --- |
| front_clk | id | global default | clock from which this new clock is derived; may be a primary or derived clock |
| Disable_Flow | flow | undef | optional empty flow that indicates when to disable the new clock |

In another embodiment, clock dividers, Enable_Flow, and other resets may be supported.

In this way, clocking, clock gating, and data flow control may be regulated automatically during the creation of the integrated circuit design, utilizing the hardware development language that is embedded in a scripting language 208. Additionally, the hardware development language may include high level built in control constructs that may be guaranteed to work and that may deal in terms of data flows. These control constructs may also be reused.

Further, the embedded hardware development language may incorporate validation and verification tests and may allow for automatic bottom up formal verification. Further still, the embedded hardware description language may be flexible and configurable, and may be compatible with a variety of programming languages (e.g., Verilog®, C++, CUDA™, etc.). Also, the embedded hardware development language may allow for debugging and visualization. For example, users may be taken to the earliest assertion failure within code, and signals may be automatically grouped.

Compute Constructs

The compute construct may include an entity (e.g., a module, etc.), implemented as part of a hardware description language, that receives one or more data flows as input and creates one or more output data flows, based on the one or more input data flows. The compute construct may include a tree function, (e.g., a function that is passed the plurality of data values and the callback function, etc.), which, in configured to apply a callback function to a plurality of data values utilizing a processor.

Further, in one embodiment, the tree function may be utilized by another function. For example, the tree function may be utilized by a Min( ) function that returns a minimum value from a hierarchical flow with multiple numerically named subflows. In another example, the tree function may be utilized by a Max( ) function that returns a maximum value from a hierarchical flow with multiple numerically named subflows. In yet another example, the tree function may be utilized by a Prio_Min( ) function that returns a minimum priority value from a numerical hierarchy flow containing priority values. In still another example, the tree function may be utilized by a Prio_Max( ) function that returns a maximum priority value from a numerical hierarchy flow containing priority values.

Further still, in one embodiment, the tree function may be utilized by a scatter-gather function. In another embodiment, the other function utilizing the tree function may be included within a compute construct. In this way, the tree function may provide an organized framework for enabling tree-structured combinatorial algorithms and associated functions.

Additionally, an N-ary function may be input by the user into a subroutine of a programming language used to draft code associated with the compute construct. In still another embodiment, the N-ary function may be created and stored, and the identification of the N-ary function may include a reference to the stored N-ary function. The N-ary function may include a function that has N significant conditions, where N is a positive integer greater than one. In another embodiment, the identification of the N-ary function may be performed by a user, utilizing a code block. For example, the identified N-ary function may be called within a general purpose code block, where such code block may include hardware design statements mixed with scripting language statements.

Further, in one embodiment, the identified N-ary function may include code that is implemented during synthesis or during simulation. In another embodiment, the identified N-ary function may be received in association with standard scripting language code. For example, the identified N-ary function may be included within one or more hardware code components that are interspersed with one or more standard scripting language statements (e.g., Perl statements, etc.).

The code block provided by the user containing the identification of the N-ary function may be used to create the control construct, such that the compute construct includes the N-ary function. In another embodiment, the compute construct may include an entity (e.g., a module, etc.), implemented as part of a hardware description language, that receives one or more data flows as input, where each data flow may represent a flow of data.

One or more activated data flows may be received by the compute construct, the compute construct may be configured to perform operations using the one or more activated data flows, and one or more output data flows may be output from the compute construct. In another embodiment, the N-ary function may include a tree-based logN combinational function. For example, the N-ary function may include a tree function (e.g., Tree( ), etc.) that performs a bottom-up, recursive traversal of data when the hardware design is built, i.e., translated by the translator 215. For example, a numerical hierarchical flow with N subflows named 0 . . . N−1 may be passed to the tree function, where each subflow may form the leaves of the tree. In another example, a leaf flow (e.g., raw bits, etc.) may be passed to the tree function, in which case the individual bits may be treated as the leaves of the tree.

Further, in one embodiment, a callback function may also be passed to the tree function. For example, for each node in the tree of logic, the tree function may call the callback function. In another embodiment, the tree may be binary, but an optional argument may be passed to the tree function that specifies a different N-ary-ness, (e.g., 3, 4, etc.). This may be used by the tree function to group nodes in each callback.

In one example, N-ary may equal 2. Additionally, in the first iteration, each callback instance of the callback function may be passed these arguments: the current level in the tree (0 for first iteration), the starting leaf index in the original flow (0, 2, 4, etc.), the number of original leaves covered by the call (2 for level 0), and up to 2 outputs from the previous level of the tree (which will be the leaves for level 0). In one embodiment, if the original flow does not have an even number of leaves, then the last callback may not cover 2 leaves.

Further still, within the tree function, during the next iteration (e.g., the next level up, level 1), a callback may be made with starting leaf index 0 and count 4, then with starting index 4 and count 4, etc. Additionally, the return values from each pair of adjacent callbacks from level 0 may be passed as arguments for this level 1 callback. The final iteration may be performed at the final level (e.g., level log2(N)−1) which may contain one callback with 2 lower-level inputs and which may produce the final output. In another embodiment, a user may control the return value of the callback. For example, the return value may be a data flow, a hash of multiple pieces of information about each partial iteration result a hash of per-node iteration information, etc.

Also, in one embodiment, starting with the leaf level which is deemed level 0, the callback function may be called with these arguments: the current tree level, the starting leaf index in the original input data flow, the number of original leaves covered by this call, and up to "N-ary" outputs from the previous stage in the tree. For the first-level calls to the callback function, up to "N-ary" leaf subflows may be passed as the inputs. The callback function may then return a single scalar entity. For the second-level calls to the callback function, the inputs may be the return values from the first-level callbacks, and the tree function may complete when it has only one callback return value left to work on, which may be returned as the result.

Additionally, in one embodiment, the N-ary function may include a function that utilizes the tree function. For example, the N-ary function may include a minimum function (e.g., Min( )) that receives a hierarchical flow with multiple numerically named subflows and returns the minimum value using the tree function. In another example, the N-ary function may include a maximum function (e.g., Max( )) that receives a hierarchical flow with multiple numerically named subflows and returns the maximum value using the tree function.

Further, in one embodiment, the N-ary function may include a priority minimum function (e.g., Prio_Min( )) that receives a numerical hierarchy flow containing priority values of any width, or a data flow that is a raw bitmask where each bit represents priority 0 or 1. The priority minimum function may also receive an argument representing the index of the subflow that should take precedence if there are ties in the priority values. The priority minimum function may use the tree function to find the minimum priority and may return the index of the subflow (leaf) holding that priority value.

Further still, in one embodiment, the N-ary function may include a priority maximum function (e.g., Prio_Max( )) that receives a numerical hierarchy flow containing priority values of any width, or a data flow that is a raw bitmask where each bit represents priority 0 or 1. The priority maximum function may also receive an argument representing the index of the subflow that should take precedence if there are ties in the priority values. The priority maximum function may use the tree function to find the maximum priority and may return the index of the subflow (leaf) holding that priority value. In one embodiment, the priority minimum function and/or the priority maximum function may be used to construct a priority-based round-robin arbiter.

Also, in one embodiment, the N-ary function may include a scatter/gather function that utilizes the tree function. For example, the N-ary function may include a gathered function (e.g., Gathered( )) that receives a scattered data flow with N valid subflows and a corresponding sparse bitmask of valid indexes, then collapses the M valid subflows down into a data flow where contiguous indexes 0 . . . M−1 contain the data. In another example, the N-ary function may include a gathered indexes function (e.g., Gathered_Indexes( )) that returns the actual gathered indexes as the resultant gathered data.

In addition, in one embodiment, the N-ary function may include a scattered index function (e.g., Scattered_Index( )) that receives a valid mask of scattered values and a gathered index, then returns the scattered index corresponding to what its gathered index would be. In another embodiment, the N-ary function may include a gathered index function (e.g., Gathered_Index( )) that receives a valid mask of scattered values and a scattered index, and returns the gathered index corresponding to that scattered index.

Further, in one embodiment, the N-ary function may include a scatter/gather function that does not utilize the tree function. For example, the N-ary function may include a scattered function (e.g., Scattered( )) that receives a pair of associated data flows, one containing M subflows of data with indexes 0 ... M−1; and another data flow containing the target scatter indexes of those data where the maximum index is N−1. The scattered function may then returns a data flow with N subflows holding the scattered data from the input data flow. For un-scattered indexes, the data may be undefined. In another embodiment, the scattered function may return a bitmask denoting which indexes in the scattered result are valid. In another example, the N-ary function may include a scattered indexes function (e.g., Scattered_Indexes( )) that calls the scattered function with the received indexes' data flow also as the data flow. In this way, the indexes themselves may be scattered.

Further, in one embodiment, the compute construct may be incorporated into the integrated circuit design in association with the one or more data flows. In one embodiment, the one or more data flows may be passed into the compute construct, where they may be checked by the translator 211. In another embodiment, errors may be immediately found and the design script may be killed immediately upon finding an error. In this way, a user may avoid reviewing a large amount of propagated errors. In yet another embodiment, the compute construct may check that each input data flow is an output data flow from some other construct or is what is called a deferred output.

Translation Into a Source Database

In one embodiment, the translation process implemented by the translator 211 generally does not perform optimization and instead identifies and reports any errors (e.g., build errors) in the design. The data flows and constructs are translated into the graph-based intermediate representation of the design 210. Consequently, the translation of a hardware design may be performed very quickly, in a matter of a few seconds for even a complex unit design. During translation of the hardware design by the translator 211, each data flow and construct may be analyzed, and, if an error is found, the translator 211 may halt immediately and report an error and/or may complete the analysis and generate an error report. In this way, errors within the hardware design may be determined immediately and may not be propagated during the execution of the hardware design and found at the end of hardware construction or during the running of a suspicious language flagging program (e.g., a lint program) on the hardware construction.

A hardware design that is successfully processed by the translator 211 without errors should build successfully with no lint errors when processed by the translators 215, 220, and 222. Additionally, the user may use a debugger application to browse the source database 212 for a hardware design examine the hardware design before processing the source database 212 using the translator 215.

As data flows are constructed, nodes are created in a node graph for each subflow in the data flow hierarchy. Specifically, each aFlow class object (e.g., data flow) represents a single node in the node graph. All types of data flows, whether the particular data flow is a leaf unsigned integer, constant, hierarchical data flow, State variable, input, or output follows the same conventions for construction and manipulation. In one embodiment the aFlow class is implemented as a tied hash. A hash is essentially tied to each corresponding node in the node graph.

As each control and compute construct is created, corresponding nodes are also added to a node graph. A hash is associated with each node in the node graph that corresponds to a control or compute construct. The first part of the translation process is to generate the nodes and associate each node with a hash. In one embodiment, the user cannot directly access the construct nodes, but can access the data flows nodes that are between construct nodes. Following translation, each data flow node (except for primary input and output data flow nodes) has a pointer to a source construct node and a destination construct node. Primary input data flow nodes have a pointer to a destination construct node and primary output data flow nodes have a pointer to a source construct node. In one embodiment, the translator 211 attaches the scripting language call stack to each node corresponding to a data flow or construct so that error messages and the debugger can help the user figure out where various language constructs were created in user code.

Figure 3A:
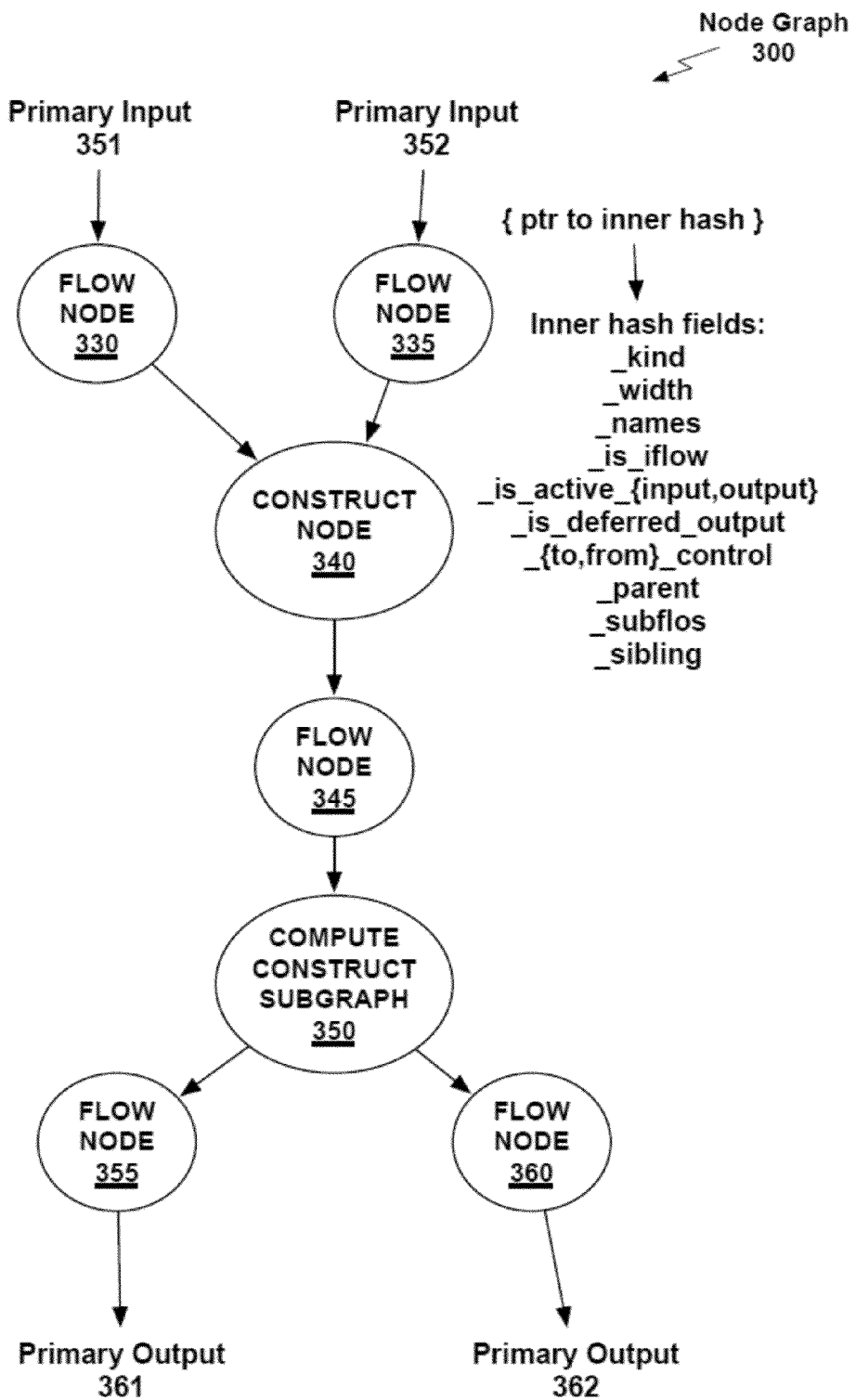
FIG. 3A shows a node graph representation of a hardware design encoded as data flows, control constructs, and a compute construct, in accordance with one embodiment.

FIG. 3A shows a node graph representation 300 of a hardware design encoded as data flows, control constructs, and a compute construct, in accordance with one embodiment. Design_Create( ) creates a graph node for the design as a whole. Design_Create( ) also records a list of all constructs in the order in which they were constructed and records a list of data flows in the order in which they were constructed. The translator 211 translates the hardware design, determining connectivity of the nodes in the node graph to generate a graph-based intermediate representation of the hardware design. A node graph is an example of a graph-based intermediate representation of the hardware design.

Each data flow is associated with a tied hash that specifies various fields that are specific to the data flow and that correspond to options selected by the user. One field is a pointer to an inner hash. A variety of fields may be specified by the inner hash of each flow node. The fields in the inner hash are used by the translator 211 and cannot be accessed by users. Examples of the fields include _kind which defines the data flow kind (e.g., leaf, hierarchical, array), _width which is the bit width of the data flow, _names which is an anonymous array of names provided by the user in the order in which the names were provided, _is_iflow which indicates if the data flow node is an interface data flow node, _is_active_{input, output} which indicates if the data flow node is an active input and/or output of a construct, _is_deferred_output which indicates that the data flow node can be used as active input, but the output not yet known, _{to,from}_control which specifies the control construct node to/from which the data flow is attached, _parent which specifies the parent flow if the data flow is a sub-flow of a hierarchical data flow, _subflows which specifies the child data flows of the data flow, and _sibling which specifies sibling data flows of the data flow (i.e., data flows having the same parent). The fields of the inner hash may be used by the translator 211 to determine the connectivity of the nodes, i.e, connections between the nodes.

Each construct is also associated with a tied hash that specifies various fields that are specific to the construct and that correspond to construct-specific options selected by the user. One field is a pointer to an inner hash. A variety of fields may be specified by the inner hash of each construct node. Examples of the fields include _out_fifo which specifies an array of FIFOs for each output iflow list, _out_rdy_reg which specifies an array of 0/1 used for each output iflow list, _out_ reg which specifies an array of 0/1 used for each output iflow list.

For example, the Separate( ) construct has one iflow in each input iflow list and each output iflow list typically has multiple iflows. In one embodiment, the number of input and output iflow lists is the same and each set of lists is associated with a different module instance, so the Separate( ) operation is performed in parallel for a superflow. The Multicast( )

construct is similar, except that there may be an additional input iflow per list if the unicast_dest or multicast_destmask is provided form a separate data flow. For the Merge( ) construct each input iflow list typically has multiple iflows and each output iflow list has one iflow. The Select( ) construct is similar, but each input iflow list may have an additional arb_flow (arbitration) iflow.

Each input iflow list of the compute( ) construct can have multiple iflows and each output iflow list may have multiple iflows. An output iflow list and state flip-flops are constructed for each input iflow list. The compute( ) construct calls back the code block as an anonymous subroutine for each set of iflow lists and the state. The code block may perform a different operation for each callback, but typically the code block performs the same operation. The code block is elaborated by the translator 211 and the elaborated code block is stored in a list for the compute construct. Duplicated code blocks are identified later to remove redundancy.

As shown in FIG. 3A, the translator 211 may be configured to generate the flow nodes 330, 335, 345, 355, and 360. The flow node 330 is coupled between the primary input 351 and the construct node 340. The flow nodes 330 will therefore each specify_to_control as the construct node 340 in the respective inner hash fields. Similarly, the flow node 345 will therefore specify the field_from_control as the construct node 340 and the field_to_control as the compute construct subgraph 350. The flow nodes 355 and 360 will each specify_from_control as the compute construct subgraph node 350 in the respective inner hash fields.

The user signals the end of the design by calling Design_Save( ). Because designs are typically for entire units, the user may be required to supply a hash of top-level I/O flows. Design_Create( ) had already created a design graph node for the design as a whole, and recorded the list of all constructs in the order in which they were created. Data flows are similarly recorded. Design_Create( ) also generated a canonical list of input iflows and lists of output iflows for each construct. The hash for each construct is added to a global list for the design graph node. The global list is traversed by the translator 211.

When Design_Save( ) is called, the translator 211 executes a checking routine called check_options( ). Each construct takes a set of name=>value argument pairs and the construct supplies the expected "type" for each argument as well as default values for optional constructs. A majority of user errors can be detected by the check_options( ) routine. User-written language extensions and generators also have access to check_options( ) for identifying errors.

The translator 211 examines the top data flows to confirm that they are either a deferred output that is not an active output (i.e., a primary input) or an active output that is not an active input (i.e., a primary output). The translator 211 then starts with the primary input data flows and traverses the design while performing connectivity checks for each data flow. Each flow is marked as "seen" when it is traversed and a list of deferred output data flows is constructed and checked to confirm that every deferred output flow was consumed as an active input flow.

The translator 211 examines all of the constructs and data flows and makes sure that all created data flows are both active inputs and active outputs of constructs. Each construct creates one or more output data flows, each of which are marked as is_active_output=1 and is_active_input=0. Any input iflows must be marked as is_active_output=1 or is_deferred_output=1 and is_active_input=0 (unless the input iflow is an inactive input that is composed entirely of constants). In one embodiment, active outputs that are still marked as deferred outputs must be primary inputs to the design and must be listed in the user's I/O hash. In one embodiment, data flows that are not active outputs must be primary outputs and must be listed in the user's I/O hash. All code block combinational data flows must read at least once, though not all of the bits of a data flow need to be used.

Design_Inst( ) is used to instantiate a sub-design. The sub-design may include one or more data flows and/or constructs. The translator 211 may automatically build the sub-design if its source database does not exist or is out of date. The user passes a hash of input/output data flows to Design_Inst( ) and the translator 211 checks and records that the input/output data flows match the top-level flow names and structures expected. Design_Inst( ) also has a repetition count for instantiating multiple copies of a design. In this case, the user passes an array of hashes, one hash for each instance. Design_Inst( ) may be configured to return an array of hashes instead of a single hash when a count is not provided. Alternatively, the user may pass a single hash where each element is an array.

Different constructs can be configured to operate on different levels of input data flows or superflows. There are various helper functions for finding all subflows at a particular level in the hierarchy (e.g., level 0 is the root or top of the data flow hierarchy). Other helper routines are used to ensure that said subflows are actually interface data flows where it's required (e.g., Select( )). These helper routines may be used by the translator 211 to identify the various data flows in the design. As previously explained, each construct produces a canonical list of related input interface data flows (i.e., iflows). Some constructs have only one list; others have only one iflow per list, but multiple lists; still other constructs have multiple lists each of which could have multiple iflows. All constructs may need to process superflows, which means that they must process sets of iflows in parallel. This is why there are lists of lists of iflows for inputs and outputs. Regardless, the format of these lists is the same for all constructs, which enables more efficient and maintainable processing by the translators 215, 220, and 222.

The construction of output data flows and output iflows within each output data flow may be construct dependent. There are some helper routines to help construct parts of the output flow structures that can be expressed in a common way (e.g., all structure above iflows). Below the iflow level, however, the contents typically need to be constructed differently for each type of construct. When a construct is created a canonical list of lists of output iflows is generated that is similar to that described earlier for inputs.

The translator 211 checks that input data flows for each construct are outputs or deferred outputs, and are not already active inputs to some other constructs. The translator 211 may use helper routines to mark the input data flows as active inputs (so other the input data flow may not be provided as an input to another construct), and output data flows are marked as active outputs, which allows the output data flows to be used as inputs to subsequent constructs.

In another embodiment, the translator 211 may analyze the data flow input to the construct and determine whether the data flow is an output flow from another construct or a deferred output (e.g., a data flow that is a primary design input, a data flow that will be later connected to an output of a construct, etc.). In this way, the translator 211 may confirm that the input data flow is an active output.

Most constructs have specific rules about the format of constructs. For example, Select( ) requires that all input iflows are part of a numeric hierarchy flow, and that they are all structurally equivalent. There are various flow introspection functions—also available to the user—that may be used by the translator 211 to perform many of these construct format checks. The translator 211 checks the format of each construct. The translator 211 may also check the out_fifo, out_reg, and out_rdy_reg options, and attach these options to the construct node inner hash field.

As the translator 211 checks various aspects of the representation of the design, the functions of the control constructs are generated the translator 211. The translator 211 records the iflows and parameters, then writes the source database 212. Generation of control construct functions may be performed by the translator 215—after the translator 211 has detected any design entry errors.

The translator 211 also elaborates code blocks within the Compute( ) constructs. For each set of input iflows (included in the iflow lists), a single set of output iflows and a set of State flows is passed by the translator 211 to the code block subroutine. As stated before, the subroutine is called for each set of iflows. The translator 211 saves the expressions and statements that are included in the subroutine in an analogous subgraph, such as the compute construct subgraph 350 shown in FIG. 3A. The translator 211 allows each call of the subroutine to produce a potentially different set of code logic, thus a separate subgraph is produced for each code block invocation. The translator 211 allows input iflow packets and State values to be referenced as many times as desired inside the code block. Output iflow subflows may be written (field by field if desired), but never read. Output and State subflows may be written within multiple places within the code block, but the translator 215 may be configured to generate an assertion check that each bit is written only once during any given cycle. The translator 211 identifies an error when a combinational expression flow is created and not used. A combinational expression flow is any expression whose ultimate inputs are input iflow fields, state fields, or the like. The combinational expression flow is a temporary flow within the compute construct and is not an output flow.

Operators and built-in functions used in a code block fall into different categories: unary, binary, ternary, and nary depending on the number of arguments. Each of these categories has 1, 2, 3, or variable number of operands the operands are named, e.g., opnd0, opnd1, etc. to maintain consistency. The translator 211 also records the operator. In one embodiment, the translator 211 performs an optimization by folding operators into constants when the operands lend themselves to that. For example 0 && $Flow always evaluates to 0, so the binary node may be marked as a constant with value 0, but the operands are still recorded for the high-level GUI waveform debugger 236. Later the translator 215 will use this constant rather than emitting logic for the operands.

In one embodiment, the translator 211 may use a scope stack during code block elaboration. A hash corresponding to the code block is pushed onto the scope stack when the code block is entered. The scope stack enables the tracking of hardware statements and expressions to ensure that hardware statements and expressions are not used outside of a code block in which they are defined. The scope stack may also be used to ensure that other constructs are not invoked within a code block and that a data flow created outside of the code block is not referenced inside the code block (except for a data flow that is constant).

The scope stack may also be used by the translator 211 to traverse if-elsif-else-endif statements in code blocks. The translator 211 pushes an If on the scope stack. When the translator 211 reaches an Elsif/Else statement, the translator 211 first makes sure that the top item on the scope stack is an If or Elsif, and then the translator 211 removes that If/Elsif and pushes the new Elsif/Else. Endif is treated similarly to Elsif/Else, but the translator 211 does not push anything back onto the scope stack. At the end of the code block, the top thing on the scope stack must be the code block itself, so a missing Endif statement will be caught by the translator 211. Note that in one embodiment, If and Elsif expressions must be 1-bit-wide. Also, If/Elsif/Else do not create a new lexical scope, allowing Perl if, for, etc. to be wrapped around parts of If clauses so that the HDL If, For( ), etc. commands can be laid down programmatically. However, inner statements are created as children of the Then or Else.

The translator 211 may be configured to traverse a given-when-default-endgiven statement in a manner similar to the if-elsif-else-endif statement. When is handled similarly to elsif, default is handled similarly to else, and EndGiven is handled similarly to Endif. No new lexical scope is created, but inner statements are created as children of the Do or Default statement. For, While, and Forever statements are also pushed onto the scope stack by the translator 211 and no new lexical scope is created, but inner statements are created as children of the Do or Forever statement. EndFor/End-While/EndForever causes the top For/While/Forever to be checked and popped by the translator 211.

The translator 211 may determine the bitrange (e.g., msb:lsb) of a root flow referred to by a bitslice or index for an iflow. The root flow is an enclosing iflow or state variable. In cases where the index is not a constant (which is allowed), the msb:lsb is unknown, but the root flow can still be recorded and used by the translator 215 to construct a case statement based on the index.

The translator 211 may also check that there are no combinational loops in the design. In one embodiment, this is accomplished using a traditional graph-cycle-detection algorithm. First, the algorithm is applied at the construct level in a conservative way. Note that out_reg breaks combinational loops at the construct level. This initial operation eliminates all data flows that can't possibly be involved in a combinational loop. For the remaining flows, the translator 211 must look inside the constructs, possibly at the bitrange level to see if the coarsely evaluated combinational loops are really combinational loops. For example, an iflow may enter a construct but the iflow may get assigned immediately to a State register, which terminates the loop. The translator 211 records all combinational loop paths in a canonical report format that can by read into the high-level GUI waveform debugger 236 for easier analysis of the identified paths.

The translator 211 determines if any errors have been detected in the design, and, if so, an error report is stored. The translator 211 also writes out the graph-based intermediate representation of the design to the source database 212. When the translator 211 has ensured that the connectivity is correct and there are no errors to report, the translator 211 writes out the graph-based intermediate representation of the design to the source database 212. When the translator 211 has successfully completed, the translator 215 should succeed without any build errors.

The format of the source database 212 may be a nested Perl data structure with anonymous hashes, anonymous arrays, and scalars. The inner hashes are saved, but the outer hashes are discarded, so that the graph-based intermediate representation of the design 210 is a graph of nodes and corresponding hashes with any data flow references changed to point to inner hashes.

Translation Into a Common Hardware Database

In one embodiment, the translation process implemented by the translator 215 translates the graph-based intermediate representation of the design 210 into a common hardware model database 216. During a first phase of the translation, the graph-based intermediate representation of the design 210 stored in the source database 212 is transformed into a form that is more suitable for processing during a second phase of the translation. During the first phase, the translator 215 identifies unique modules and creates an instance of each unique module. The translator 215 assigns module names and iflow input/outputs to the different unique modules.

During the second phase the translator 215 produces hardware module nodes that are included in the graph-based common representation of the hardware design for each unique module identified in the first phase. In the context of the present description, a hardware module node for a unique module includes a field to point to the corresponding unique module. In various embodiments, the corresponding unique module may or may not have a field to point back to the original construct, as previously described. The hardware design may include multiple instances of each unique module. The translator 215 associates a list of one or more instances with each unique module. Therefore, the logic for the unique module need only be generated once, even when multiple instances of the unique module are included in the hardware design.

Figure 3B:
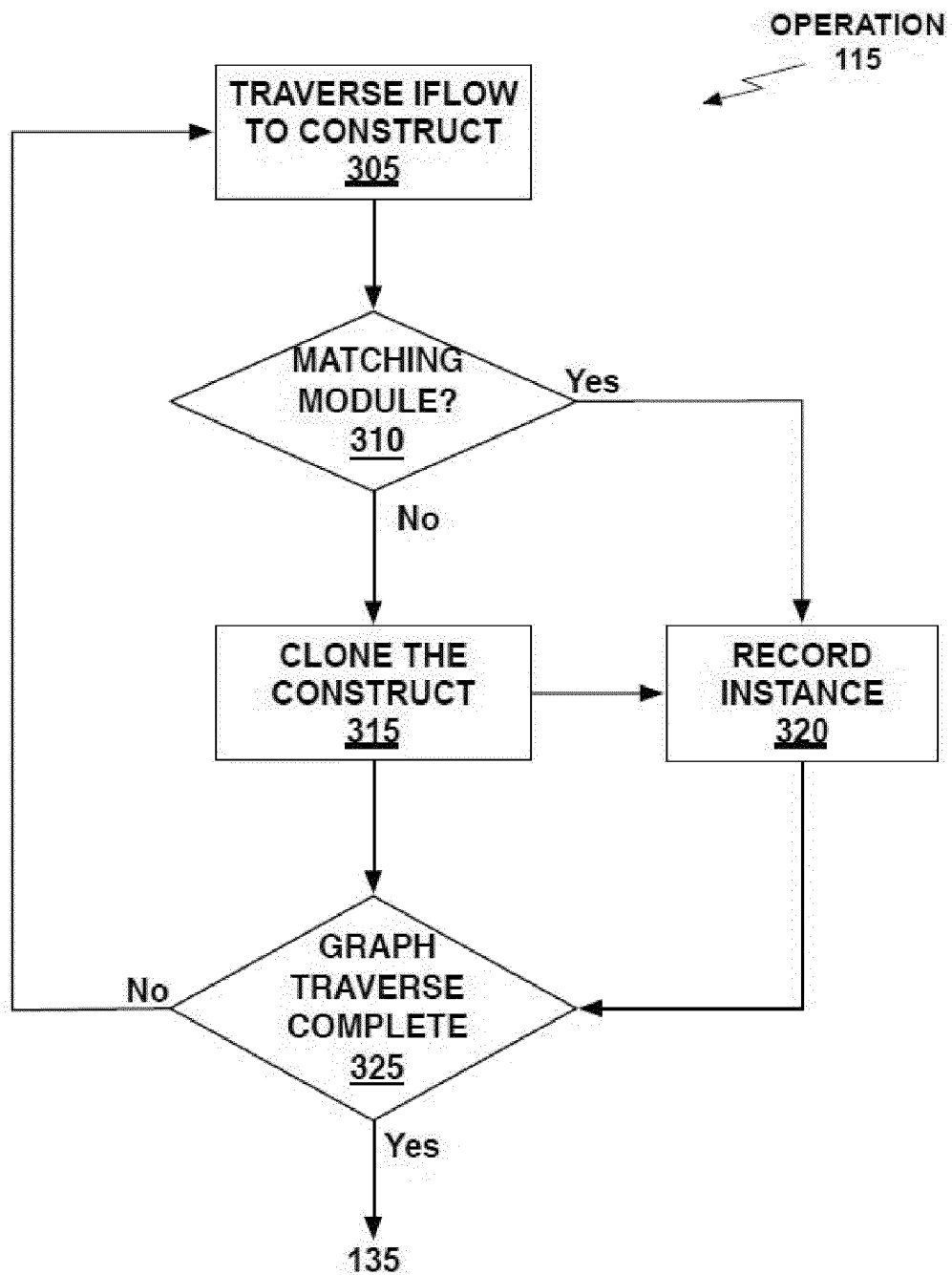
FIG. 3B shows a method for performing an operation shown in FIG. 1B, in accordance with one embodiment.

FIG. 3B shows a method for performing operation 115 shown in FIG. 1B during which instances of each unique module are determined, in accordance with one embodiment. As an option, the operations may be carried out in the context of the functionality of FIGS. 1A, 1B, 2, and 3A. Of course, however, the operations may be implemented in any desired environment. It should also be noted that the aforementioned definitions may apply during the present description.

As shown in operation 305, the graph-based intermediate representation of the hardware design that is stored in the source database is traversed by the translator 215 starting with the primary input flows of the hardware design. The primary input flows are traversed to reach the initial constructs. The translator 215 processes each construct independently as one or more modules. The outputs of the constructs are similarly traversed to reach other constructs in the hardware design. The translator 215 traverses the graph-based intermediate representation of the hardware design until all constructs are processed.

For each construct, the translator 215 goes through the list of input and output iflows, which were organized by the translator 211. In one embodiment, the number of iflows in each input iflow list is the equal and the number of iflows in each output iflow list is also equal. The translator 215 analyzes the input iflows and the output iflows using a utility function to determine if the translator 215 has already generated a unique module that matches the construct being processed. When traversing the first set of iflows, the translator 215 has not yet generated a unique module, so the translator 215 clones the original construct, including any code block included within the original construct. Each unique module is associated with a pointer to the original construct (i.e., the source node). A pointer is also associated with the source node in the graph-based intermediate representation of the hardware design that points to the unique module. In one embodiment, the translator 215 marks each construct that is traversed, so that each construct is only processed once.

Each original construct that is cloned by the translator 215 becomes the first unique module corresponding to the original construct. When the original construct includes a code block, the translator 215 also clones the code block. For subsequent sets of iflows, the translator 215 compares the structure of each iflow against one or more unique modules and, if there is a code block, all statements within the code block are also compared to the code block of the unique modules. When a set of flows and code block (if any) of a construct being processed by the translator 215 are completely 100% structurally equivalent to a unique module, the translator 215 need not create another unique module.

As shown in operation 310, the translator 215 determines if a construct being processed matches a unique module, and, if so, at operation 320, the translator 215 records the construct as an instance of the unique module that is shared by different sets of iflows. Otherwise, at operation 315, the translator 215 clones the original construct to generate a new unique module and then, at operation 320, records the construct being processed as an instance of the new unique module.

As shown in operation 325, the translator 215 determines if traversal of the graph-based intermediate representation of the hardware design is complete, and, if not, the translator 215 returns to operation 305. Otherwise, all of the nodes in the graph-based intermediate representation of the hardware design have been traversed, and the translator continues to operation 135. As the translator 215 traverses the hardware design, the new unique module will be compared with the iflows and constructs to identify any matches.

The translator 215 also maintains a list of the unique modules that is used identify matches when constructs are processed. The translator 215 also maintains a list of uniques for each original construct that is cloned. As previously described, each unique module has a list of instances, insts. The insts list includes the first instance and each additional instance of the unique module. For example, when a superflow is used, a unique module may have multiple instances that each correspond to an iflow of the superflow. The translator 215 has generated connections between instance iflows that represent top-level design module wires to input and output iflow ports of the unique modules. The connections may be used by the translators 220 and 222 to build a top-level design module. Each iflow interface wire is connected to port of a unique module or an input or output to the design. In one embodiment, each iflow interface also has a unique name, e.g., <from_instance_iflow>TO_<to_instance_iflow>, that incorporates the instance name.

When operation 115 is completed by the translator 215, the top-level unique module instances and connections are organized and, in phase two the translator 215 builds the logic, e.g., a hardware module node, for each unique module. In one embodiment, during the second phase the translator 215 akGenModel makes akMethod calls to create a new akModel module for each unique module. A hardware module node for a unique module includes a field to point to the corresponding unique module and, as previously described, the corresponding unique module has a field to point back to the original construct. akModel is called to record the input and output iflow ports for the unique module and to perform construct-specific generation of nodes. The types of the generated nodes are linked onto a list for the hardware module node.

Figure 4A:
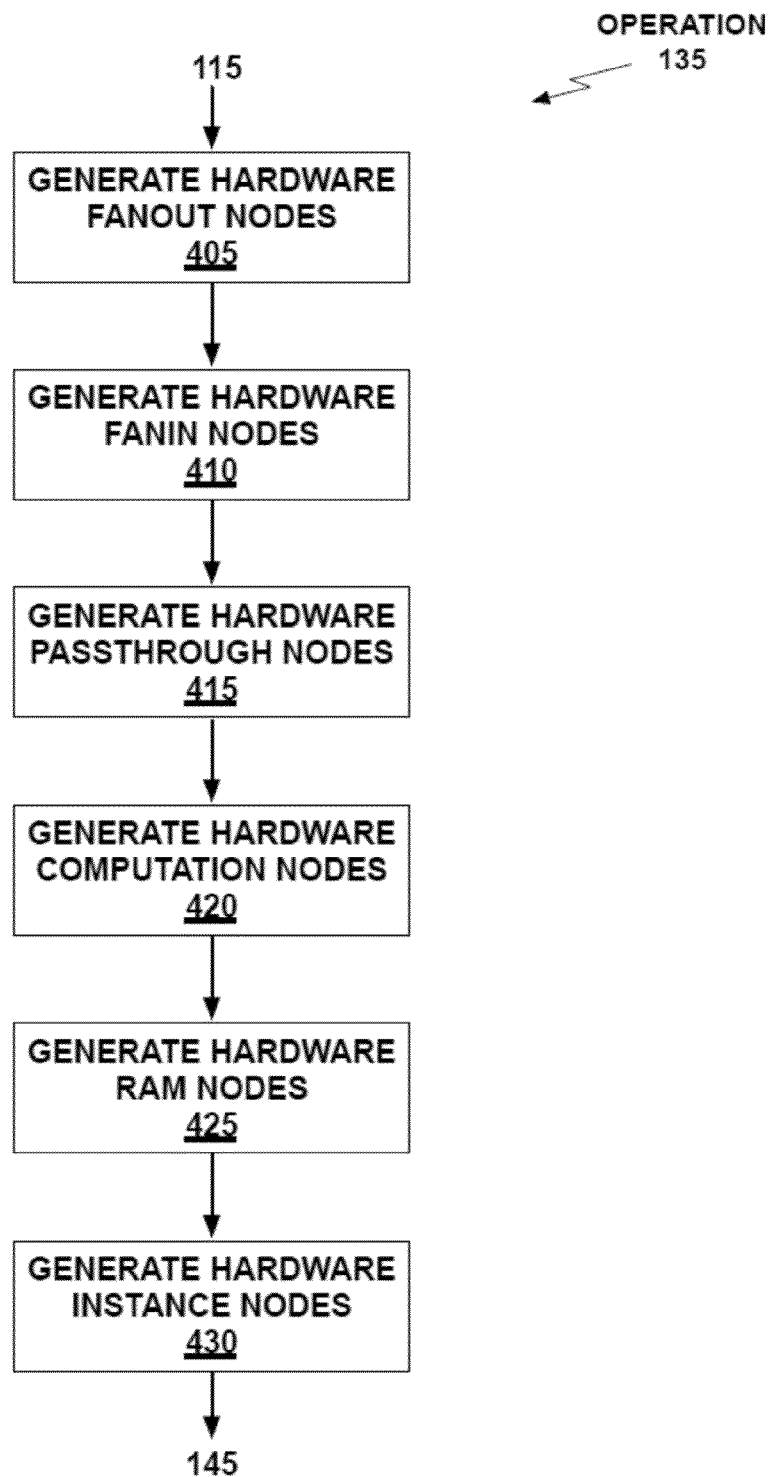
FIG. 4A shows a method for performing an operation shown in FIG. 1B, in accordance with one embodiment.

FIG. 4A shows a method for performing the operation 135 shown in FIG. 1B to generate a hardware module node of a particular type for each unique module, in accordance with one embodiment. As shown in operation 405, the translator 215 generates hardware fanout nodes corresponding to the Separate( ) and Multicast( ) control constructs. Multicast( ) has some side flows such as Unicast_Dest or Destmask_Flow and these iflows are included in the set of in ports for the module. The translator 215 determines the input fields and related bitrange for each output iflow for the Separate( ) control construct. Lists of the bitrange pieces are maintained. The Multicast( ) construct has an output iflow that consumes the entire input iflow bitranges. The Separate( ) and Multicast( ) constructs may be translated into an hm_fanout{fctl, data} type of node.

As shown in operation 410, the translator 215 generates hardware fanin nodes corresponding to the Merge( ) and Select( ) control constructs. Select( ), like Multicast( ) may have some side iflows such as Arb_Flow that is include in the set of in ports for the module. The input iflows for the Merge( ) construct are concatenated to produce the output iflow. The Select( ) and Merge( ) constructs may be translated into an hm_fanin{fctl,data} type of node.

As shown in operation 415, the translator 215 generates hardware passthrough nodes corresponding to the Connect( ), As( ), and Shuffle( ) control constructs. In one embodiment, the hm_passthrough nodes correspond to modules contain only wires. Instances of the Separate( ) and Merge( ) control constructs that occur above the iflow level may also translate into hm_passthrough nodes because only wiring exists above the iflow level.

As shown in operation 420, the translator 215 generates hardware computation nodes for Compute( ) constructs. As shown in operation 425, the translator 215 generates hardware array nodes for ram-based state. The translator 215 tracks all reads and writes to RAM instances. The reads and writes are later used to infer the number of write and read ports that are needed for the RAM. In some cases, the translator 215 will also infer that a write and a read do not occur the same cycle (e.g., If do_rd Then read Else write Endif) so the translator 215 will combine the read and write ports into a single read/write port of the RAM.

As shown in operation 430, the translator 215 translates module instances to equivalent hardware instance nodes. The translator 215 may also take the root flow bitrange assignment list and split the root assignments into multiple sublists, where each sublist contains new root bitrange assignment nodes that are for a particular msb:lsb range. When all of the unique modules and instances have been translated, the translator 215 stores the graph-based common representation of the hardware design.

The translator 215 maintains an enable stack to generate an hm_enable boolean expression that is associated with each statement in a code block. Each logic element that is generated for a statement is also associated with the hm_enable boolean. In addition to an enable stack, the translator 215 also maintains an expression stack for post-fix operation generation, and methods may be employed by the translator 215 to move and copy values back-and-forth between the enable stack and expression stack. The hm_enable value at the top of the enable stack is recorded for each hardware logic node that is generated for the code block. The hm_enable values may be used during Verilog generation by the translator 220 as well as by the high-level GUI waveform debugger 236. In particular, the high-level GUI waveform debugger 236 may be configured to highlight (with colors) enabled statements and grayout disabled statements displayed for each clock cycle. The hm_enable values are particularly useful for flip-flops and output assignment expressions.

State and Out flow non-blocking assignments require some special post-processing at the end of a code block. Specifically, the translator 215 may use akModel to take a list of hm_root_assigns for a given root and split the assignments by bit subranges that are referenced by these different assignments. For example, two different bitranges may be in the hm_root_assigns, [15:8] and [11:5] that overlap for bits [11:8]. Within each bit range, each participating assignment may have a different enable. Therefore, akModel ends up with a list of lists of hm_root_assigns where each sub-list is for hm_root_assigns with the same particular bit range. For example, the hm_root_assigns may be converted into a list of lists including [15:12], [11:8], [11:8], and [7:5]. The hm_root_assigns may be split up into multiple pieces and re-processed to achieve the final list. However, having a list of lists makes allows the translator 215 to use akGenModel to generate the final non-blocking assignments that can be directly translated into Verilog® 226.

In one embodiment, the translator 215 uses akModel to process each module. akModel abstracts the implementation of the hardware model (HM) database 216 format from akGenModel and provides a set of utility functions that are used by akGenModel. During timing closure, an optimizer is able to manipulate the hardware model database 216 as needed without knowledge about how the source database was translated by the translator 215 to generate the hardware model database 216. The hardware model database 216 includes representation such as modules, instances, and "wire names" so that the hardware model database 216 can be translated into languages such as Verilog®, C++, CUDA™ and other data-parallel language such as OpenCL without requiring any changes to the hardware design model 202.

Translation into a Logic Code Model of a Hardware Design

The graph-based common representation of the hardware design that is stored in the hardware model database 216 includes hardware module nodes, each representing a type of logic. In one embodiment, the hardware module nodes are higher level than one would find in the intermediate language used by a typical synthesis tool such as Design Compiler® that has an intermediate language based on generic standard cells. The graph-based common representation of the hardware design is a target-independent representation that may be translated into Verilog® and similar register-transfer-level languages such as VHDL (VHSIC (very-high-speed integrated circuits) hardware description language) and System Verilog®. The translator 220 is configured to translate the hardware model database 216 into a logic code model that includes generated logic code and the generated flow control code, such as Verilog® code 226 representing the hardware design. The logic code model may be synthesized and/or simulated.

In one embodiment, the hardware model database 216 contains a list of unique modules, each of which contains a list of logic nodes, e.g., hm_* logic nodes. The translator 220 creates a module header for the module based on the input and output iflows. In one embodiment, the input and output iflow ports consume a valid signal, a ready signal, and a data bus. Wires are declared as assigned during evaluation of combinational expressions. There may be a level of hierarchy above the unique models, the top-level design module. The top-level design module is one flat module that specifies all the wires for the iflows between module instances. Each module contains a list of logic nodes as produced by the translator 215. Each different type of logic node has a corresponding subroutine that is used by the translator 215 to translate the particular type of logic node into logic code.

Figure 4B:
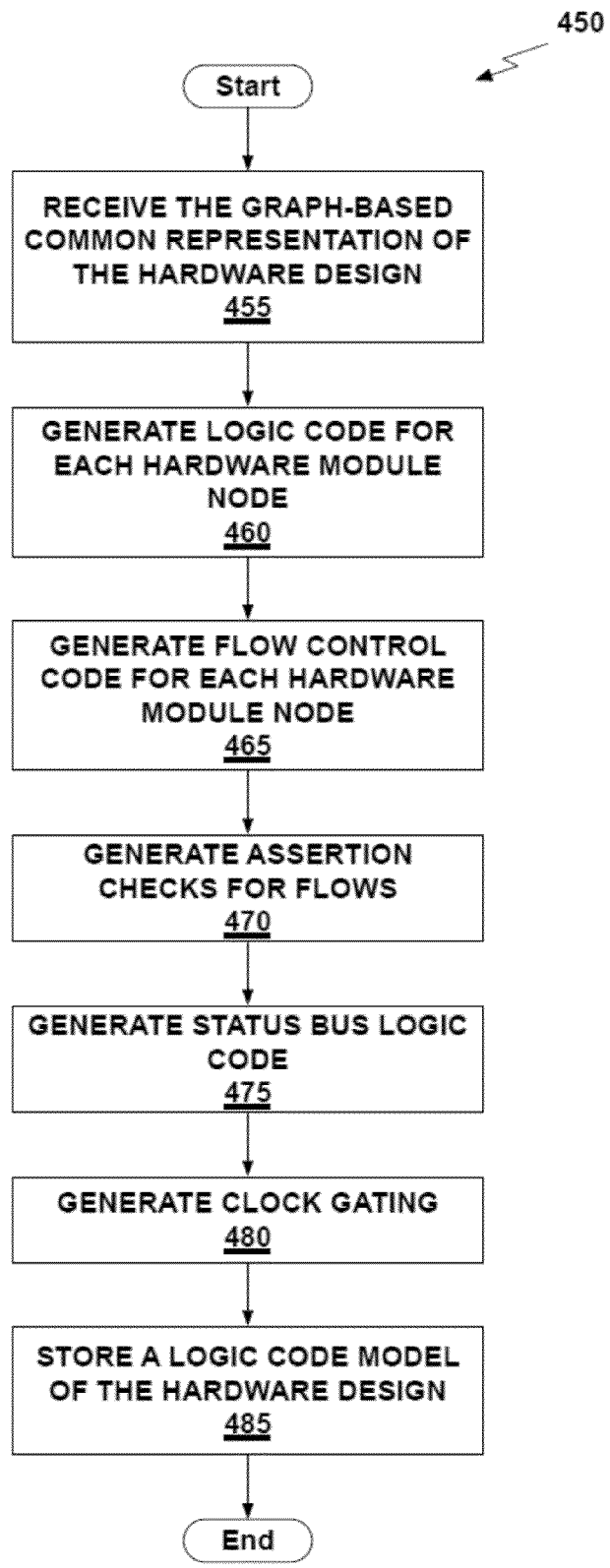
FIG. 4B shows another method for translating a common hardware database into a logic code model of a hardware design, in accordance with one embodiment.

FIG. 4B shows another method 450 for translating a common hardware database into a logic code model of a hardware design, in accordance with one embodiment. As shown in operation 455, the graph-based common representation of the hardware design stored in a common hardware database is received. As shown in operation 460, logic code for each hardware module node in the common hardware database is generated. A new Verilog® module is initialized for each hm_module. In particular, the translator 220 may be configured to initialize a new Verilog® module with a module header, input and output ports, and state variable registers and rams may be declared. The ports, registers, and RAMs can then be referenced by expression nodes.

In one embodiment, the top-level design hm_module contains a list of instances (e.g., hm_inst nodes) for each sub-module instantiation. The associated input and output flows (e.g., hm_interfaces) between instantiated submodules are also specified, so that corresponding wires may be declared by the translator 220 to generate logic code for each hardware module node. Each hm_inst has a set of hm_io ports that attach to both the unique hm_module for the instance as well as the hm_interface representing the actual wires going or coming from another instance or correspond to top-level inputs and outputs. The interface wires may be declared within the top-level module for the design. Other types of logic nodes that may be included within an hm_module are hm_fanout, hm_fanin, hm_passthrough, hm_computation, hm_reg, hm_mem, and the like. The top-level design hm_module may include one or more hm_derived_clock nodes that are generated to provide block-level clock gating logic.

In one embodiment, the logic nodes may be generated in multiple passes. In a first pass, logic nodes that are not output hm_pstage are generated. Output hm_pstage logic nodes handle optional out_fifo, out_reg, etc. at the output of the module, for one output iflow. The translator 220 generates combinational assignments to innermost output iflow data, and the logic corresponding to the output hm_pstage nodes that is coupled between the inner logic and the final output to the inputs of a downstream construct. In a second pass, the root assignments may be generated. In a third pass, the output hm_pstage nodes may be generated to handle the output iflow handling. Generation of the data flow control code for each hardware module node is shown in operation 465. The data flow control code may be specific for each input and output interface of a hardware module node. For example, flow control code may be generated according to whether the stallable parameter specifies automatic flow control is to be performed for the hardware module node.

In one embodiment, the Separate( ) and Multicast( ) hm_fanout nodes are actually split by the translator 215 into hm_fanout_fctl and hm_fanout_data nodes corresponding to control logic and data logic, respectively. The translator 220 processes hm_fanout_fctl replicating an input valid signal for each potential output iflow. The translator 220 ANDs the replicated input valid signals with the optional destination mask (Destmask) to produce a set of valid signals for the outputs, which can be provided by an associated code block or by one of the input iflows. The set of valid signals for the outputs may be connected to logic generated when an hm_pstage node is processed by the translator 220.

At operation 465, the translator 220 generates the flow control code based on whether the interface was specified as stallable or non-stallable for the construct. If the stallable option is specified, the input to the Separate( ) or Multicast( ) logic must be stalled if any targeted output is stalled and ready=0 is provided to the input iflow(s). At operation 470 the translator 220 generates one or more assertion checks for one or more iflows. If, during simulation, the condition tested by the assertion occurs, the assertion is flagged. The high-level GUI waveform debugger 236 may examine the assertions that are flagged during a simulation to display signal waveforms at points in time where each of the flagged assertions occurs. An hm_assert node represents a user assertion and the translator 220 generates logic code to pass the assertion expression wire_name to common code that is used to generate all assertions. The assertions may be added to a per-design list so that the high-level GUI waveform debugger 236 can quickly access the assertions. In one embodiment, an assertion may by used to disable the clocks when a condition tested by the assertion occurs in an emulation environment to aid in debugging.

If the not stallable option is specified, the translator 220 generates an assertion check that ensures that the input iflow(s) are not ever stalled. If, during simulation, an input iflow is stalled, the condition is flagged by the assertion check. The assertion may be performed for innermost valid/ready interfaces that are inputs to an hm_pstage. If the innermost valid=1 and ready=0 then the module generating the output associated with the valid signal may drop the output. For cases where there are multiple input iflows (which can happen only for Multicast where there is a separate Unicast or Destmask iflow), for stallable=1, the translator 220 generates logic code to stall the input iflows until both input iflows are valid. When stallable=0, the translator 220 generates an assertion check to test that both input iflows are invalid or both input iflows are valid, because there is no way to stall just one of the two input iflows. This is a separate assertion check that is performed on the input iflows for constructs that can have multiple input iflows, such as the Merge( ) construct, Multicast( ) construct, and Select( )construct (with arb_flow).

The translator 220 processes the hm_fanout_data by concatenating the different bit range pieces from the main input iflow to produce the output data bus for that output iflow. For Separate( ), the concatenation can vary for each output iflow. For Multicast( ), each bit range is always the entire input iflow.

The hm_fanin nodes for Merge( ) and Select( ) are also split by the translator 215 into hm_fanin_fctl and hm_fanin_data nodes corresponding to control logic and data logic, respectively. The translator 215 may also generate an hm_arb node representing the calculated arbitration decision for Select( ) and attach the hm_arb node to the hm_fanin_fctl. The translator 220 generates logic code by processing the hm_arb node. The logic code produces an arbitration decision that affects the calculation of the input ready signals. Specifically, the translator 220 generates logic code so that the input ready signals are masked with the arbitration decision so that all non-chosen input iflows are gated. In addition, the translator 220 generates logic code so that if the output iflow is stalled, all input iflows are stalled. However, if stallable is 0, then the translator 220 instead generates an assertion check to test that input iflows are never stalled. For the hm_fanin_data node, the translator 220 generates logic code implementing a case statement multiplexer when there is an hm_arb node for Select( ).

To process hm_fanin_fctl for Merge( ), the translator 220 generates an assertion check to test that all input iflows are either all valid or all invalid. In contrast, for Select( ), the translator 220 may generate an assertion check that only one input iflow is valid when the stallable option is 0. For hm_fanin_data when there is no hm_arb node (i.e., a Merge( )), the translator 220 generates logic code to concatenate the input iflow data.

hm_passthrough is generated by the translator 215 for control constructs that are translated into wires by the translator 220. The number of input and output iflows is identical and the translator 220 generates logic code to connect bits of the corresponding input and output iflows together. In another embodiment, the translator 220 may generate logic code to connect bits of the corresponding input and output iflows together in the top-level module rather than creating a submodule that simply assigns wires.

In one embodiment, at operation 475, the translator 220 generates logic code for a status bus for each hardware module by processing an hm_status node. The status indicates the processing state of the hardware module and may be implemented as an enumeration type, e.g., idle, active, and stalled. The status may be specific to the output iflow for the hardware module or may represent the overall status for the hardware module by merging the output iflow status with input valids. The idle status indicates whether the hardware module is idle and is not processing data. The active status indicates whether the hardware module is processing data. The stalled status indicates whether the hardware module is stalled by a downstream module. The status bits are used to implement module-level and higher-level clock gating. The hardware module may have the input clock disabled (i.e., gated off) when the active status is stalled or idle. hm_status may be predeclared by an hm_computation node. In one embodiment, the user can also override the status using the Status statement. The overall status is used by the translator 220 to generate logic code that controls the second-level (i.e., design level) clock gating.

At operation 480, the translator 220 generates code for user-specified manual clock-gating logic when an hm_derived_clock node is processed. When automatic clock gating is used, the translator 220 produces logic code to compute the 3-bit status for each output iflow and the statuses are combined to produce a status for the construct as a whole (including the input) to determine the overall status of the construct.

When manual clock-gating is used, the translator 220 uses a combinational expression to produce a status signal for the clock enable. When all of the hardware nodes have been processed, at operation 485, the translator 220 stores a logic code model of the hardware design. In one embodiment, the logic code model is represented in Verilog and the logic code model is stored as Verilog 226. In other embodiments, the logic code model of the hardware design is represented in different language. The translator 220 may be configured to optionally run various lint programs such as Spyglass and Ascentlint. The translator 220 may also be configured to optionally build a simulator using a generated or user-supplied simTop.v file.

Additional hardware nodes may be included in a computation node and are also processed by the translator 220 to generate logic code. An hm_computation node represents a compute( ) construct and the translator 220 generates logic code to declare the wires for the signals associated with each output iflow. An hm_reg node represents a state register and the translator 220 generates logic code to declare a corresponding register that may be assigned later.

An hm_mem node represents a RAM, and the translator 220 generates logic code to declare a RAM and all ports for the RAM. In one embodiment, the translator 220 calls a RAM generator to generate logic code for the RAM. Inputs and outputs for the RAM may be assigned within the main code block logic. The translator 220 may generate logic code to handle various RAM options, such as whether the output is registered, calling out to a flip-flop or latch array generator, and setting up handling of stalling of read data output, as well as producing delayed valid signals for downstream logic that consumes the read data that is output from the RAM one or more clock cycles later.

An hm_mem_write node represents a memory write port. The translator 220 generates logic code to assign the write signals predeclared by hm_mem to the signals specified by the hm_mem_write node. An hm_mem_read node represents a memory read port. The translator 220 generates logic code to assign the read signals predeclared by hm_mem to the signals specified by the hm_mem_read node. Any hm_mem_rw nodes are ignored by the translator 220, because hm_mem_rw nodes also have associated hm_mem_write and hm_mem_read nodes that are processed by the translator 220. The translator 220 generates logic code to multiplex the read and write signals and adds an assertion that only write or read is valid per cycle per port.

An hm_flow_ref node represents part of a previously declared or computed iflow, i.e., a bit range of a wire bus. The translator 220 translates the hm_flow_ref node into logic code for a new wire. An hm_valid node represents $In->Valid( ) and the translator 220 generates logic code for a wire representing the input iflow valid signal. When stallable=1, the translator 220 generates logic code to AND the valid signal with the ready signal. An hm_ready node represents $Out->Ready( ) and references the innermost ready signal (i.e., ready signal before any optional FIFO or register at the output) that was predeclared by hm_computation and assigned later. An hm_transferred( ) node represents $Out->Transferred( ) and references a wire predeclared by hm_computation for which the translator 220 will generate logic code to generate the wire signal. In one embodiment, the wire that is generated may be assigned when an hm_pstage node is processed by the translator 220. An hm_stall node represents Stall $In and the translator 220 generates logic code assigning a wire that is predeclared by an hm_computation node. The assigned value is the hm_enable for the hm_stall node and the wire is inverted, then ANDed with the input iflow ready signal.

An hm_numeric_hier_read node is used to handle reads of numeric hierarchy nodes (Hier_N) with a dynamic index values (i.e., $Flow[<$Index>]. When an hm_numeric_hier_read node is processed by the translator 220, logic code is generated for a case statement multiplexer that multiplexes in the proper msb:lsb bit range of the appropriate root flow. If the index (i.e., $Index) is a constant when the translator 220 processes the hm_numeric_hier_read node, then logic code for a bitslice in the $Flow is generated instead of a case statement. An hm_bitslice node is processed by the translator 220 to generate logic code for a wire corresponding to the specified bitslice when the msb and lsb are constants. When the source flow is a constant, the constant is assigned to a wire and then the wire is bitsliced by the translator 220 to allow Verilog® to compute the sub-constant.

hm_unary, hm_binary, and hm_ternary nodes may be used to generate a Verilog operator or a combination of Verilog operators. The translator 220 generates logic code for a wire that may be wider than the source, so the translator 220 automatically zero-extends the result, if needed. When an hm_binary node is processed the result width is wider than the width in the hm_binary node, truncation (e.g., *& or +&) may be implemented by the translator 220. The hm_ternary node corresponds to the ?: conditional ternary operator. An hm_nary node may be used to generate a variable-argument operator. The translator 220 generates logic code for concatenation when a Concat( ) node is processed. The translator 220 generates logic code for a case statement multiplexer when a Mux( ) node is processed. Some functions may be translated into DesignWare math components, e.g., DW_sum, DW_tree, DW_ldz, etc., by the translator 220.

An hm_stop node may be used for recording of the stop hm_enable for the high-level GUI waveform debugger 236. Advancing the state_variable to an unused state may be implemented using other logic nodes that are generated by the translator 215. An hm_exit node may be used to record the hm_enable and exit status for the high-level GUI waveform debugger 236. The hm_exit node invokes the exit( ) system call with the return status expression, terminating a simulation. Although the hm_exit node is not synthesizable, an assertion may be generated by the translator 220 for use in emulation.

For printf, the translator 215 generates lists including an expanded format string and expanded set of leaf iflows for an hm_printf node. The translator 220 then generates a Verilog® $write( ) call with the format and argument references. The formatted result may be saved in a string by the translator 220 so that the high-level GUI waveform debugger 236 can access the formatted result for display.

An hm_pstage node is used to handle the final output path for an output iflow. When an hm_pstage node is processed by the translator 220, logic code is produced to optionally generate an out_fifo (i.e., a FIFO at the output), logic code is produced to optionally generate an out_rdy_reg skid register stage, and logic code is produced to optionally generate an out_reg for registering the output data. The translator 220 also produces logic code to assign the output iflow 3-bit status wire that may be predeclared by an hm_computation node. The logic code for the status wire accounts for the out_fifo when an out_fifo is generated using a status that is produced by a FIFO generator. If needed, the translator 220 also generates logic code to compute a "transferred" wire (if needed by an hm_transferred node). A transferred signal is asserted when an output is successfully transferred as an input to another module. When out_rdy_reg=0 the final out_valid and raw out_ready are used. If out_rdy_reg=1, the out_valid and out_rdy result is registered and transfer of the output to the other module is delayed.

Figure 4C:
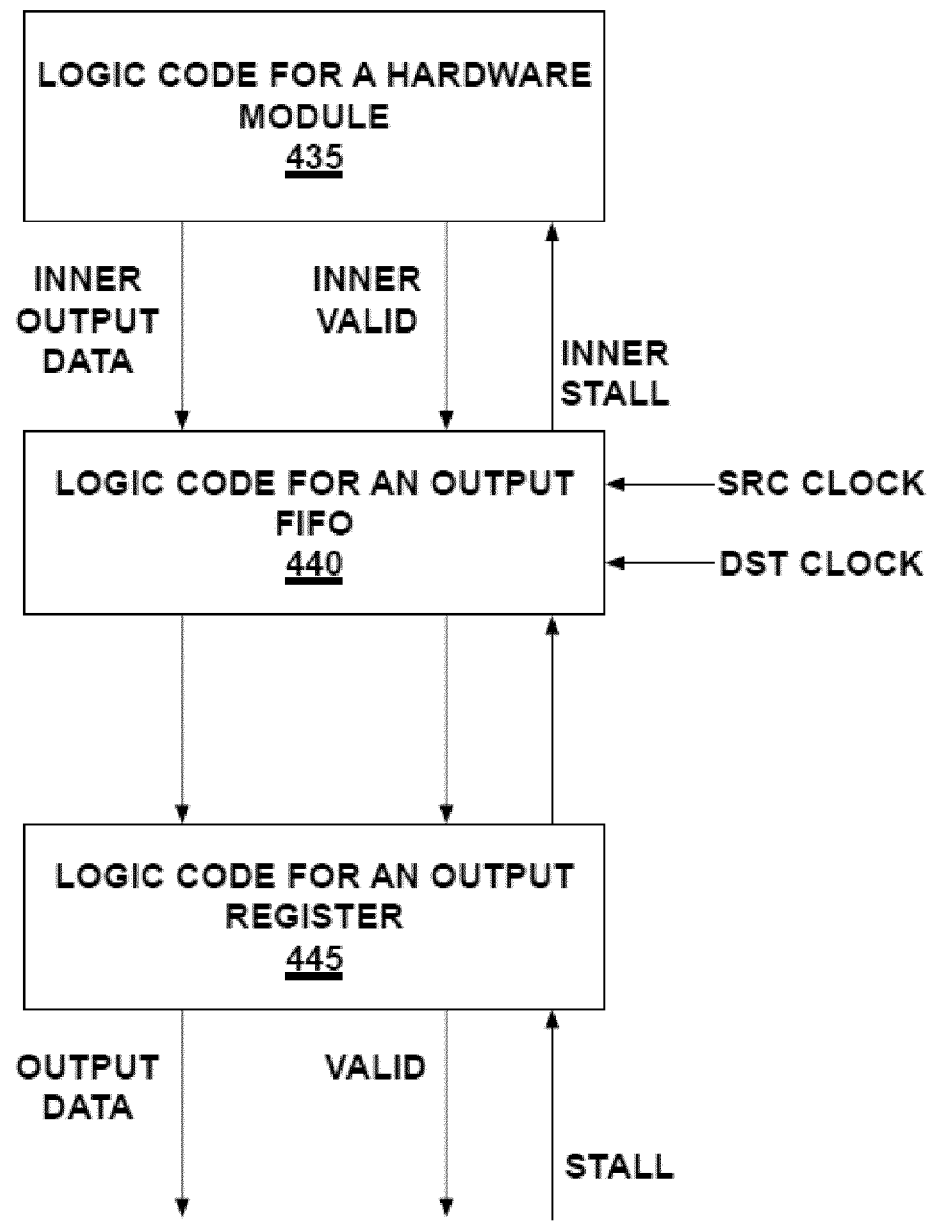
FIG. 4C illustrates a hardware module and an optional output first-in first-out (FIFO) buffer and output register, in accordance with one embodiment.

FIG. 4C illustrates a hardware module and an optional output FIFO and an optional output register, in accordance with one embodiment. Logic code for a hardware module 435 is generated by the translator 220 and, when the out_fifo option is specified for a construct, logic code for an output FIFO 440 is generated by the translator 220. If the translator 220 determines that the FIFO passes signals between two different clock domains, i.e., the source module (i.e., logic code for a hardware module 435) clock (src clock) and the destination module clock (dst clock) are different frequencies, the logic code for an output FIFO 440 is implemented as an asynchronous FIFO. When the out_reg option is specified for a construct, logic code for an output register 445 is generated by the translator 220. The outermost output data and valid signals are provided to the downstream module and the stall signal from the downstream module is input to the stall input. Innermost output data and valid signals are generated by the logic code for a hardware module 435 and an inner stall signal is input to the logic code for a hardware module 435. In one embodiment, one or more of the logic code for an output FIFO 440 and the logic code for an output register 445 is not generated by the translator 220. When the out_rdy_reg option is specified for a construct, logic code for an out_rdy_reg skid register stage is also generated by the translator 220.

Figure 5:
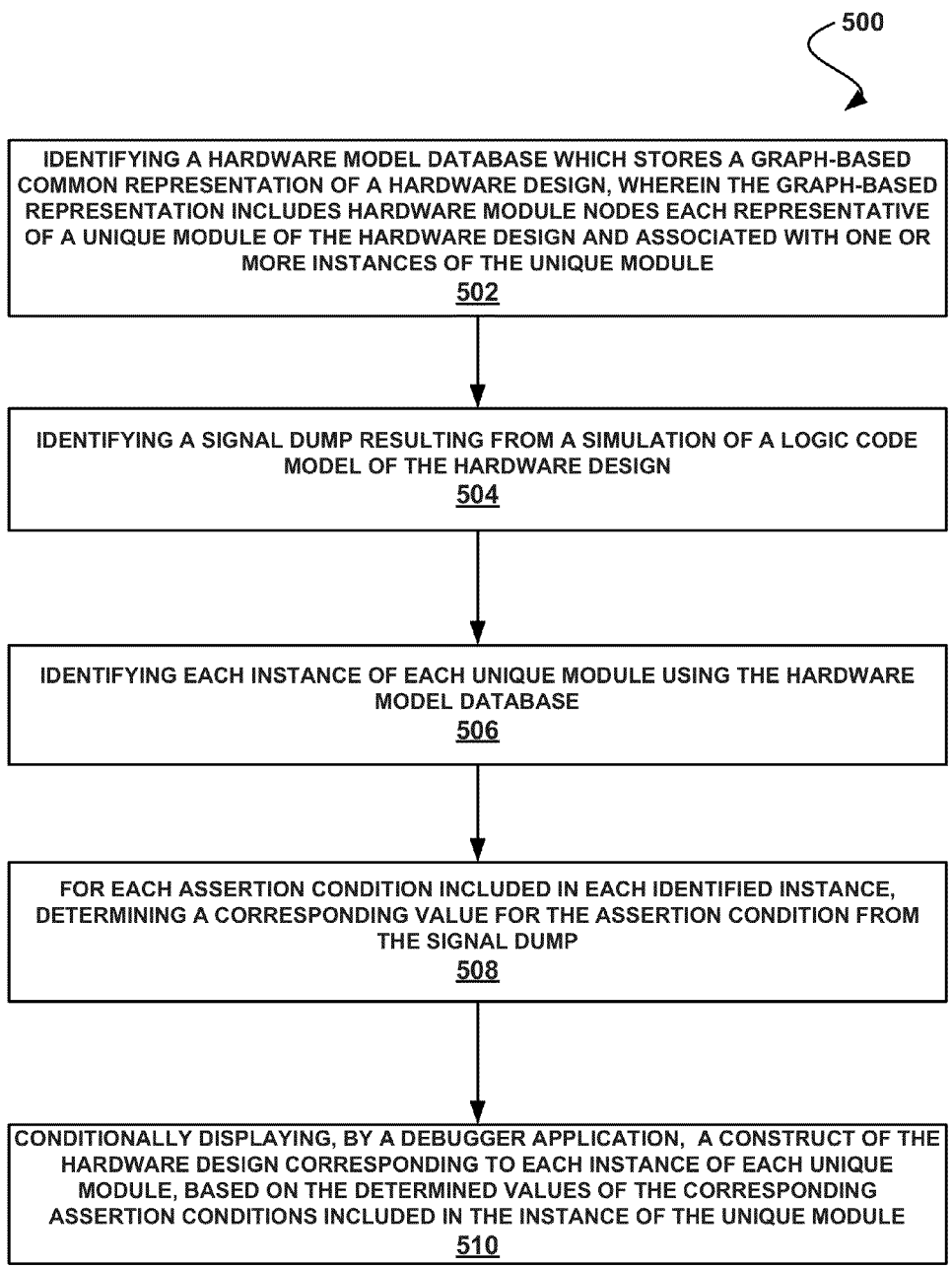
FIG. 5 illustrates a method for providing a debugger using a common hardware database, in accordance with one embodiment.

FIG. 5 illustrates a method 500 for providing a debugger using a common hardware database, in accordance with one embodiment. As shown in operation 502, a hardware model database is identified which stores a graph-based common representation of a hardware design, wherein the graph-based representation includes hardware module nodes each representative of a unique module of the hardware design and associated with one or more instances of the unique module. Additionally, as shown in operation 504, a signal dump resulting from a simulation of a logic code model of the hardware design is identified. Further, in operation 506, each instance of each unique module is identified using the hardware model database, and in operation 508, for each assertion condition included therein (e.g. user or system generated), a corresponding value for the assertion condition is determined from the signal dump. Further, in operation 510, a construct of the hardware design corresponding to each instance of each unique module is conditionally displayed by a debugger application, based on the determined values of the corresponding assertion conditions included in the instance of the unique module.

Figure 6A:
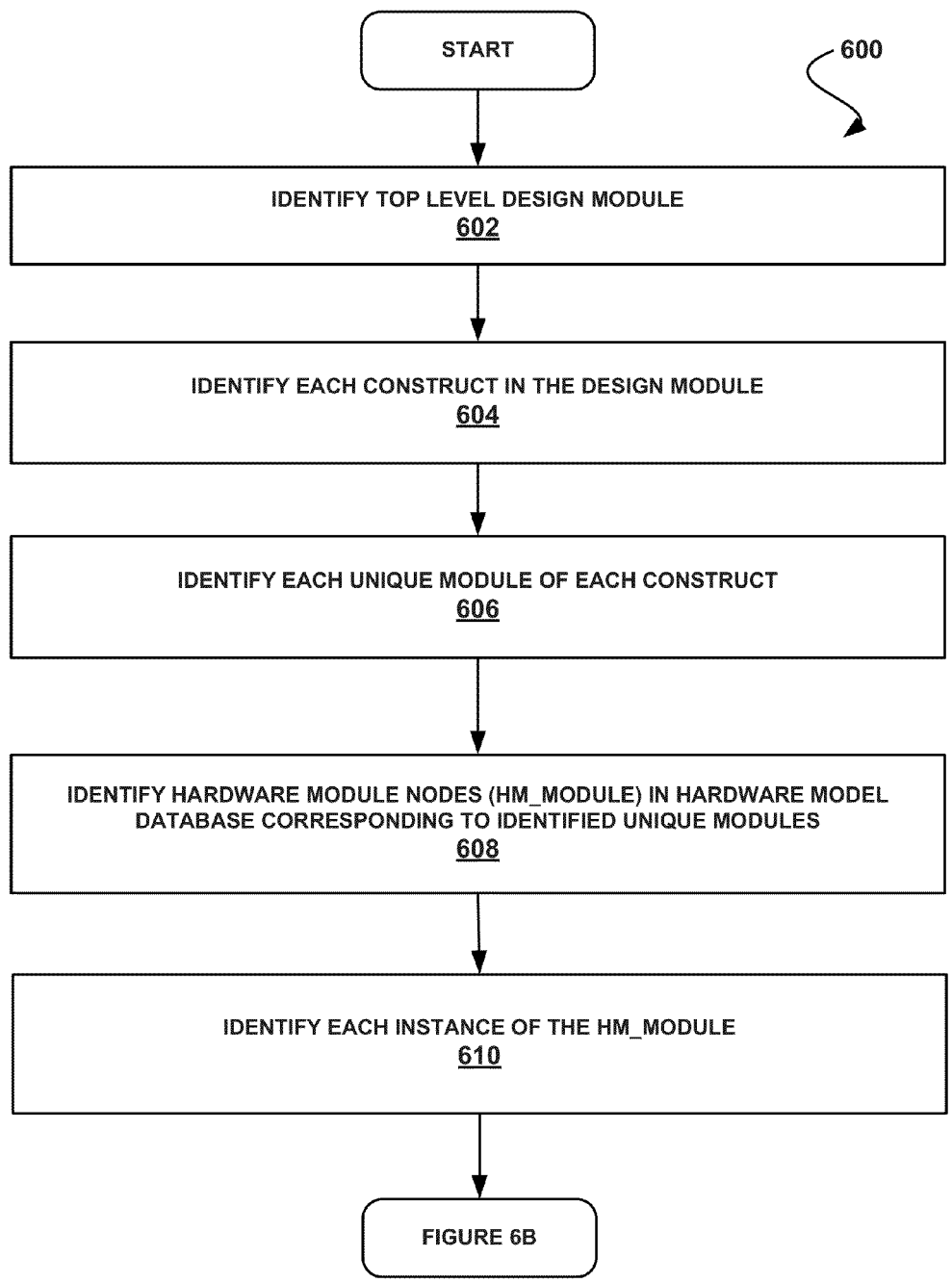
FIGS. 6A-6B illustrate a method for identifying constructs of a hardware design to be displayed as nodes by a debugger, in accordance with one embodiment.
Figure 6B:
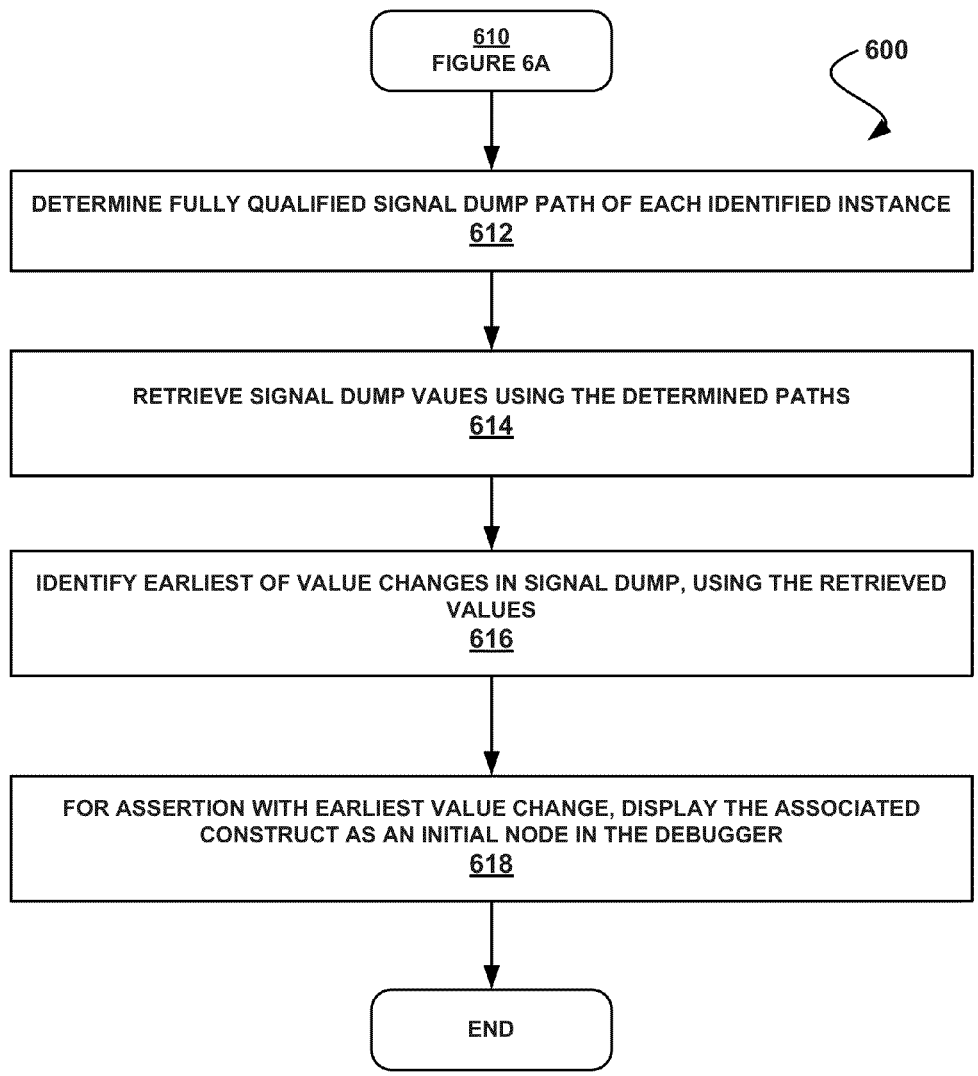

FIGS. 6A-6B illustrate a method 600 for identifying constructs of a hardware design to be displayed as nodes by a debugger, in accordance with one embodiment. As shown in operation 602, a top level design module is identified. Each construct in the design module is then identified in operation 604. A control list (e.g. Perl array) in the original source code may be used to identify the design module constructs.

For each identified construct, each unique module of the construct is identified, as shown in operation 606. Hardware module nodes (hm_module) in a hardware model database that correspond to the identified unique modules are then identified in operation 608. In other words a hardware version of each unique module is identified. Further, as shown in operation 610, each instance of the hm_module is identified (e.g. from a list of instances contained in the hm_module).

A fully qualified signal dump path of each of the identified instances is determined in operation 612. The signal dump path may be the name of an instance (e.g. as opposed to the name of a signal). For example, each hm_module may include a list of assertions (i.e. having conditions), such that a wire name from each assertion can be concatenated with an instance path name to provide the full path name to the assertion wire.

Signal dump values are then retrieved in operation 614 using the determined paths. A signal dump application programming interface (API) may provide a list of value changes, including a starting value and an ending value, along with a timestamp of the value change. In the present embodiment, a signal change for an assertion wire may be indicative that the assertion fired (i.e. the assertion condition was met). Thus, for each assertion condition, it may be determined during the simulation whether the assertion condition occurs, and a value for an assertion condition may change when such assertion condition occurs (i.e. is met).

The retrieved values are used to identify an earliest value change in the signal dump (i.e. an earliest fired assertion), as shown in operation 616. For the assertion with the earliest value change (i.e. the earliest assertion condition that was met during the simulation), the associated construct is displayed as an initial node in the debugger, as shown in operation 618. Accordingly, the construct having an assertion that fired first (e.g. during simulation) may be displayed at a topmost portion of a debugger GUI. Further, it should be noted that a construct of the hardware design corresponding to an instance of a unique module may be displayed (i.e. in the debugger GUI) when a determined value for an assertion condition included in the instance indicates that the assertion condition was met during the simulation.

Figure 7:
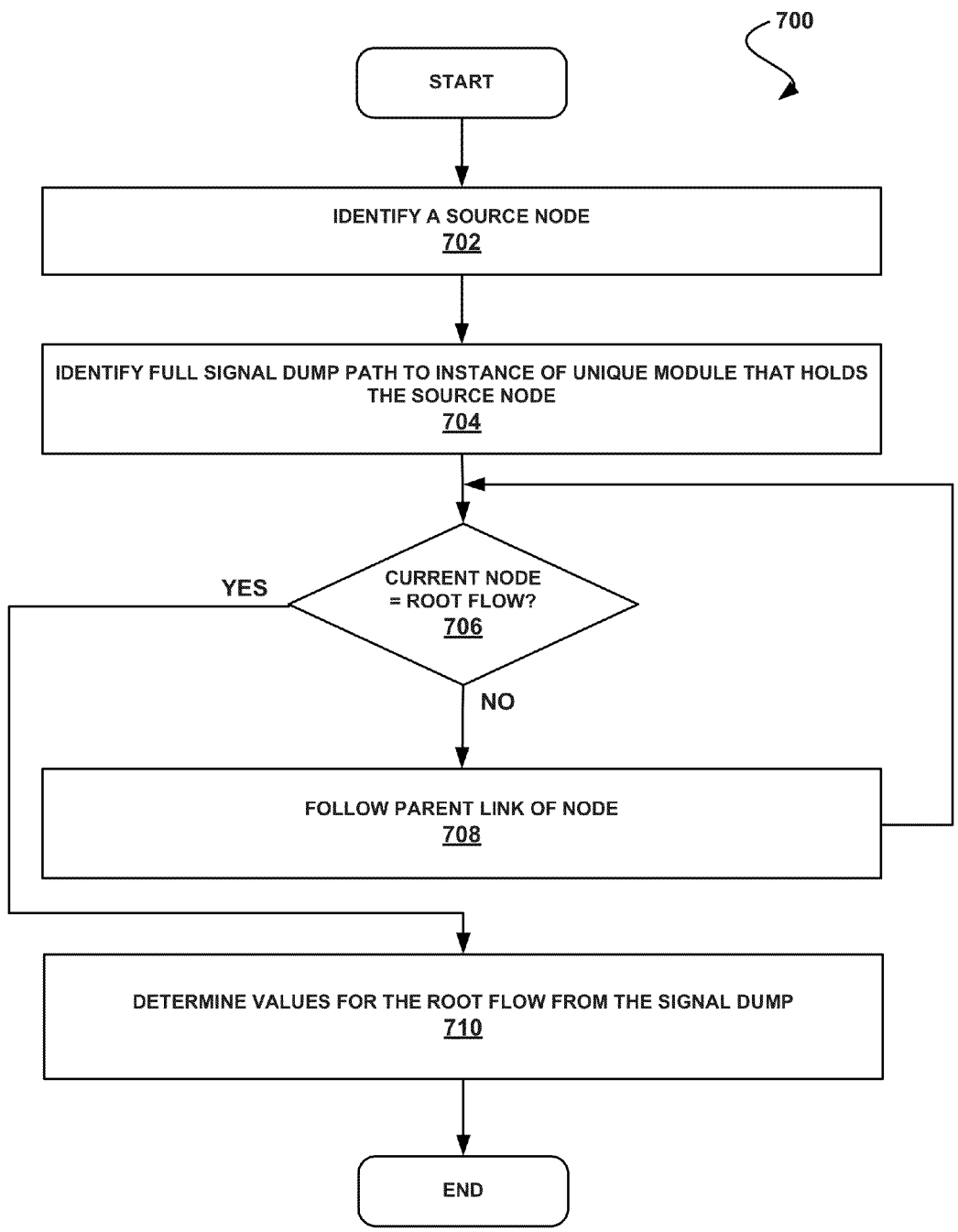
FIG. 7 illustrates a method for determining from a signal dump signal values for a node displayed by a debugger, in accordance with one embodiment.

FIG. 7 illustrates a method 700 for determining from a signal dump signal values for a node displayed by a debugger (e.g. for display thereof), in accordance with one embodiment. As shown in operation 702, a source node (i.e. original construct) is identified. A full signal dump path to an instance of a unique module that holds the source node is also identified, as shown in operation 704.

It is then determined in decision 706 whether the current node (i.e. source node when following operation 704) is a root flow. If the current node is not a root flow, a parent link (i.e. _parent) of the current node is followed as shown in operation 708. Operations 706 and 708 are repeated until a root flow is encountered. Once a root flow is encountered, values for the root flow are determined from the signal dump, as shown in operation 710. The root flow may be used to identify a wire name according to which the values may be determined from the signal dump. As an option, in an embodiment where the bitrange (e.g., msb:lsb) of the root flow is not already set, the bitrange may be calculated during traversal to the root flow. Further, the determined values for the root flow may be saved so that they are subsequently available with reference to any subflow under the root flow.

Figure 8A:
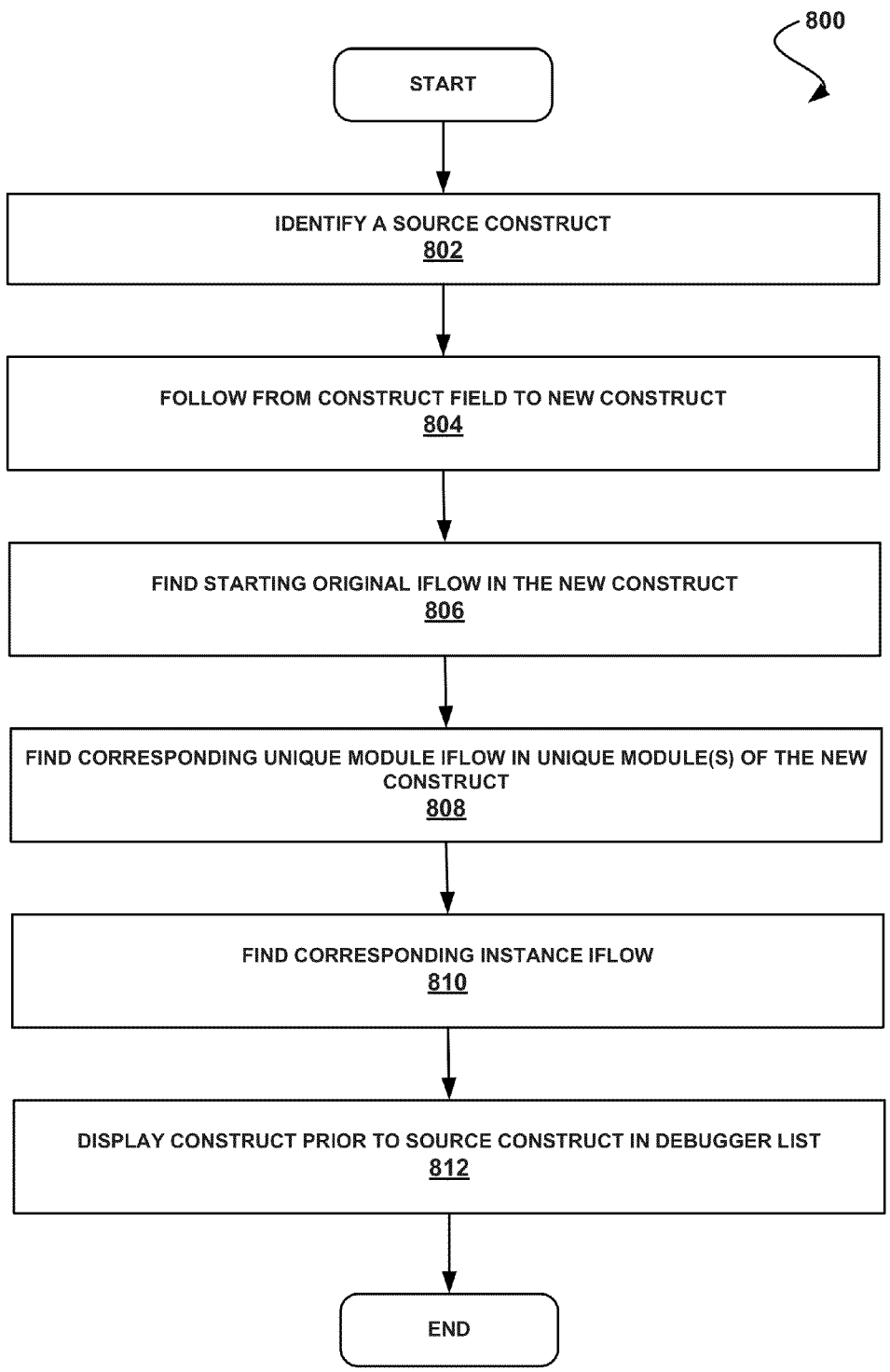
FIG. 8A illustrates a method for identifying a source iflow of a node displayed by a debugger, in accordance with one embodiment.

FIG. 8A illustrates a method 800 for identifying a source iflow of a node displayed by a debugger, in accordance with one embodiment. The present method 800 may be performed when a user selects via debugger GUI a source option to go to a source of a particular node displayed in the GUI. As shown in operation 802, a source construct is identified. In the present embodiment, the source construct is the construct represented by the node for which the source option is selected by the user.

In operation 804, a from construct field (_from_construct) of the source construct is followed to a new construct. The _from_construct may be set by a compiler. In one embodiment, the _from_construct may point directly to the source iflow.

In another embodiment where the node is included in one sub-design, the _from_construct may be associated with another sub-design. In that embodiment, the current instance of the sub-design that includes the node may be identified, and then the method 800 may switch to the corresponding instance iflow (e.g. using the instance name to determine the corresponding instance iflow). It should be noted that a similar process may be used to traverse through multiple different sub-designs if necessary. Similarly, in yet another embodiment when going into a Design_Inst( ) construct, the instance to be entered is determined. From the primary input/output iflow within that instantiated unique module, the construct within the sub-design is identified.

Further, as shown in operation 806, a starting original (i.e. source) iflow in the new construct is found. The starting original iflow corresponds to that listed in the _from_construct of the source construct. It should be noted that in the situation where the starting instance's iflow has changed due to leaving or entering sub-designs, the current operation 806 as well as any further operations of the method 800 may apply to the new starting original iflow.

A corresponding unique module iflow in any of the unique modules of the new construct is then found, as show in operation 808. A corresponding instance iflow is then found, as shown in operation 810. For example, the corresponding instance iflow may be that which is connected to the same interface wires as the starting original iflow.

As a result of operation 810, a particular instance of a particular unique module of a particular construct is identified, and in operation 812 a list of constructs is reordered such that the construct is displayed in the list of constructs of the debugger GUI prior to (i.e. above) the source construct. Further, the debugger may switch to the newly displayed construct as a current node.

Figure 8B:
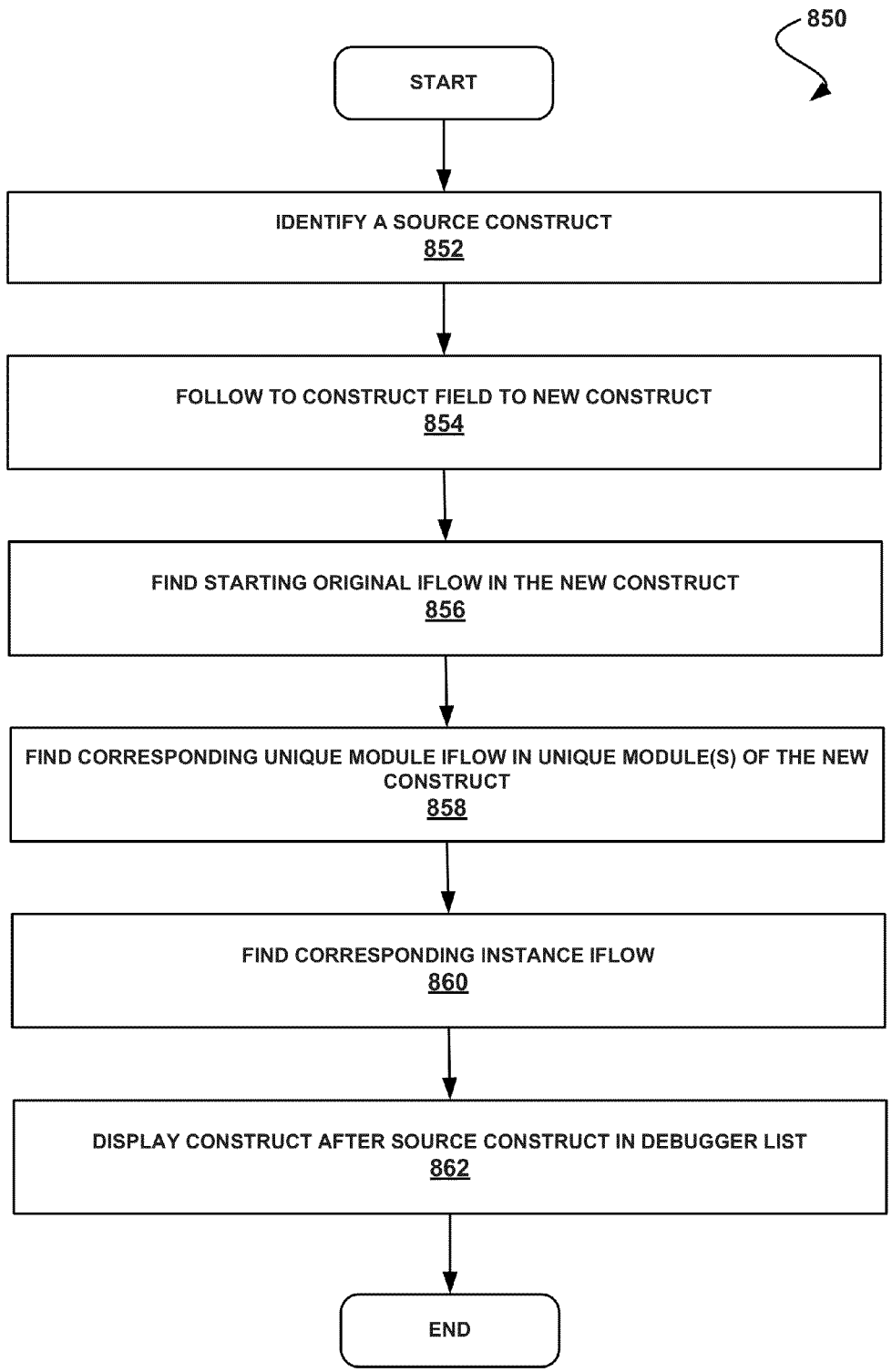
FIG. 8B illustrates a method for identifying a destination iflow of a node displayed by a debugger, in accordance with one embodiment.

FIG. 8B illustrates a method 850 for identifying a destination iflow of a node displayed by a debugger, in accordance with one embodiment. The present method 850 may be performed when a user selects via debugger GUI a destination option to go to a destination of a particular node displayed in the GUI. As shown in operation 852, a source construct is identified. In the present embodiment, the source construct is the construct represented by the node for which the destination option is selected by the user.

In operation 854, a to construct field (_to_construct) of the source construct is followed to a new construct. The _to_construct may be set by a compiler. In one embodiment, the _to_construct may point directly to the destination iflow.

In another embodiment where the node is included in one sub-design, the _to_construct may be associated with another sub-design. In that embodiment, the current instance of the sub-design that includes the node may be identified, and then the method 850 may switch to the corresponding instance iflow (e.g. using the instance name to determine the corresponding instance iflow). It should be noted that a similar process may be used to traverse through multiple different sub-designs if necessary. Similarly, in yet another embodiment when going into a Design_Inst( ) construct, the instance to be entered is determined. From the primary input/output iflow within that instantiated unique module, the construct within the sub-design is identified.

Further, as shown in operation 856, a starting original (i.e. source) iflow in the new construct is found. The starting original iflow corresponds to that listed in the _to_construct of the source construct. It should be noted that in the situation where the starting instance's iflow has changed due to leaving or entering sub-designs, the current operation 856 as well as any further operations of the method 850 may apply to the new starting original iflow.

A corresponding unique module iflow in any of the unique modules of the new construct is then found, as show in operation 858. A corresponding instance iflow is also found, as shown in operation 860. For example, the corresponding instance iflow may be that which is connected to the same interface wires as the starting original iflow.

As a result of operation 860, a particular instance of a particular unique module of a particular construct is identified, and in operation 862 a list of constructs is reordered such that the construct is displayed in the list of constructs of the debugger GUI following (i.e. below) the source construct. It should be noted that the constructs may be automatically reordered by default, but the user may switch between showing dynamic (i.e. to show recently visited constructs close together) versus the original ordering (i.e. as created in the source code). Further, the debugger may switch to the newly displayed construct as a current node.

Figure 9:
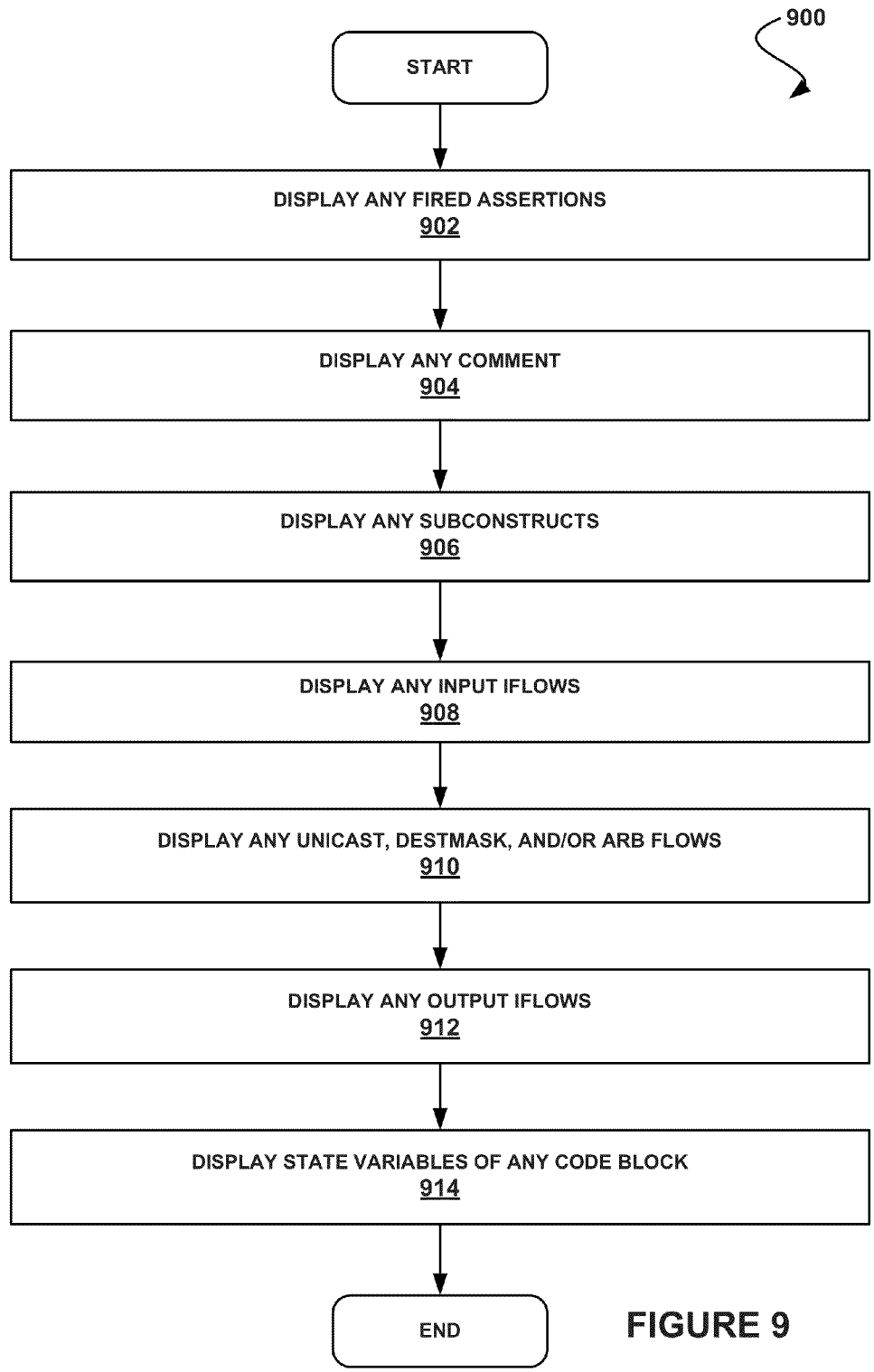
FIG. 9 illustrates a method for drawing a construct, in accordance with one embodiment.

FIG. 9 illustrates a method 900 for drawing a construct, in accordance with one embodiment. In the present embodiment, the construct corresponds to a unique module as opposed to a source construct. Additionally, the present method 900 may be performed when a user selects via debugger GUI an expansion option to expand a particular node displayed in the GUI.

As shown in operation 902, any fired assertions associated with the construct represented by the node are identified and displayed. The fired assertions may be identified from any fired assertions previously determined from the signal dump with respect to the method 600 of FIGS. 6A-6B above. In operation 904, any comments associated with that construct are identified and displayed.

In operation 906, any subconstructs of the construct are identified and displayed. The subconstructs may be identified from a _controls_list of the construct and displayed in an original or dynamic order. In operation 908, any input iflows of the construct are identified and displayed. In operation 910, any unicast, destmask, and/or arb flows associated with the construct are identified and displayed. In operation 912, any output iflows of the construct are identified and displayed, including the outermost and innermost values. Further, in operation 914 state variables of any code blocks (e.g. Compute( )) of the construct are identified and displayed. For example, since the current unique module instance is known, from that any corresponding code block can be identified and traversed for display thereof.

Optionally, the debugger GUI may also display valid fifo contents in order. These contents may be identified by reading the fifo generator RAM and any bypass flops in the fifo. Additionally, the out_rdy_reg skid flip-flop value may be displayed, in addition to the out_reg value. Further, all RAM contents may be identified from the signal dump and displayed. Where the signal dump is a full dump, the RAM contents may be identified from all related writes in the dump. Where the signal dump is a partial dump, the RAM contents may be identified from all related writes and reads in the dump.

Figure 10:
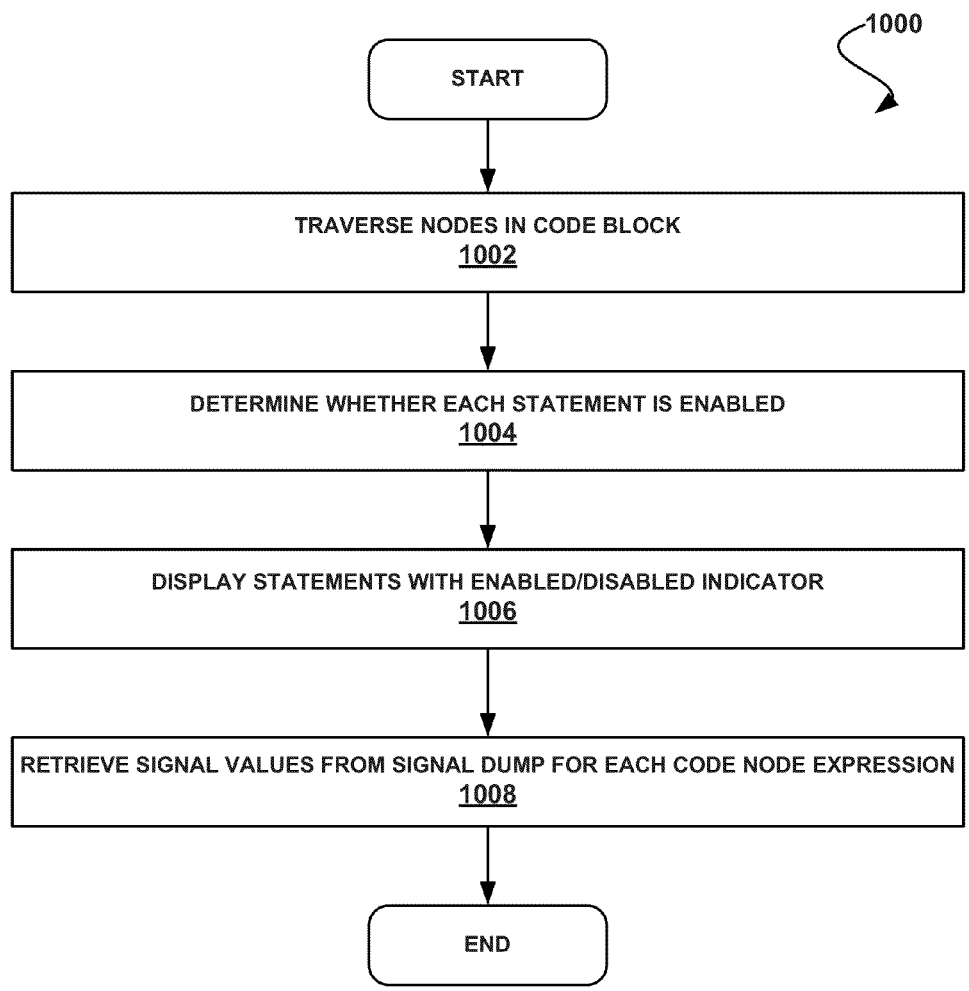
FIG. 10 illustrates a method for drawing a code digest for a construct displayed as a node by a debugger, in accordance with one embodiment.

FIG. 10 illustrates a method 1000 for drawing a code digest for a construct displayed as a node by a debugger, in accordance with one embodiment. For example, the method 1000 may be performed for identifying and displaying the code block(s) in operation 914 of the method 900 described above with reference to FIG. 9.

As shown in operation 1002, nodes in the code block are traversed to identify each statement in the code block. Additionally, it is determined whether each identified statement is enabled, as shown in operation 1004. This determination may be made using the hm_enable associated with each statement. The statements are then displayed by the debugger GUI in operation 1006 with an enabled/disabled indicator, in accordance with the determination of operation 1004. For example, enabled statements may be displayed in a first color (e.g. green) or a plurality of colors whereas disabled statements may be displayed in a second color (e.g. red). Moreover, signal values from a signal dump are retrieved for each code node expression, as shown in operation 1006. The signal values may be displayed with the node for only a current cycle, but may be displayed in a waveform on the debugger GUI for all cycles.

Figure 11A:
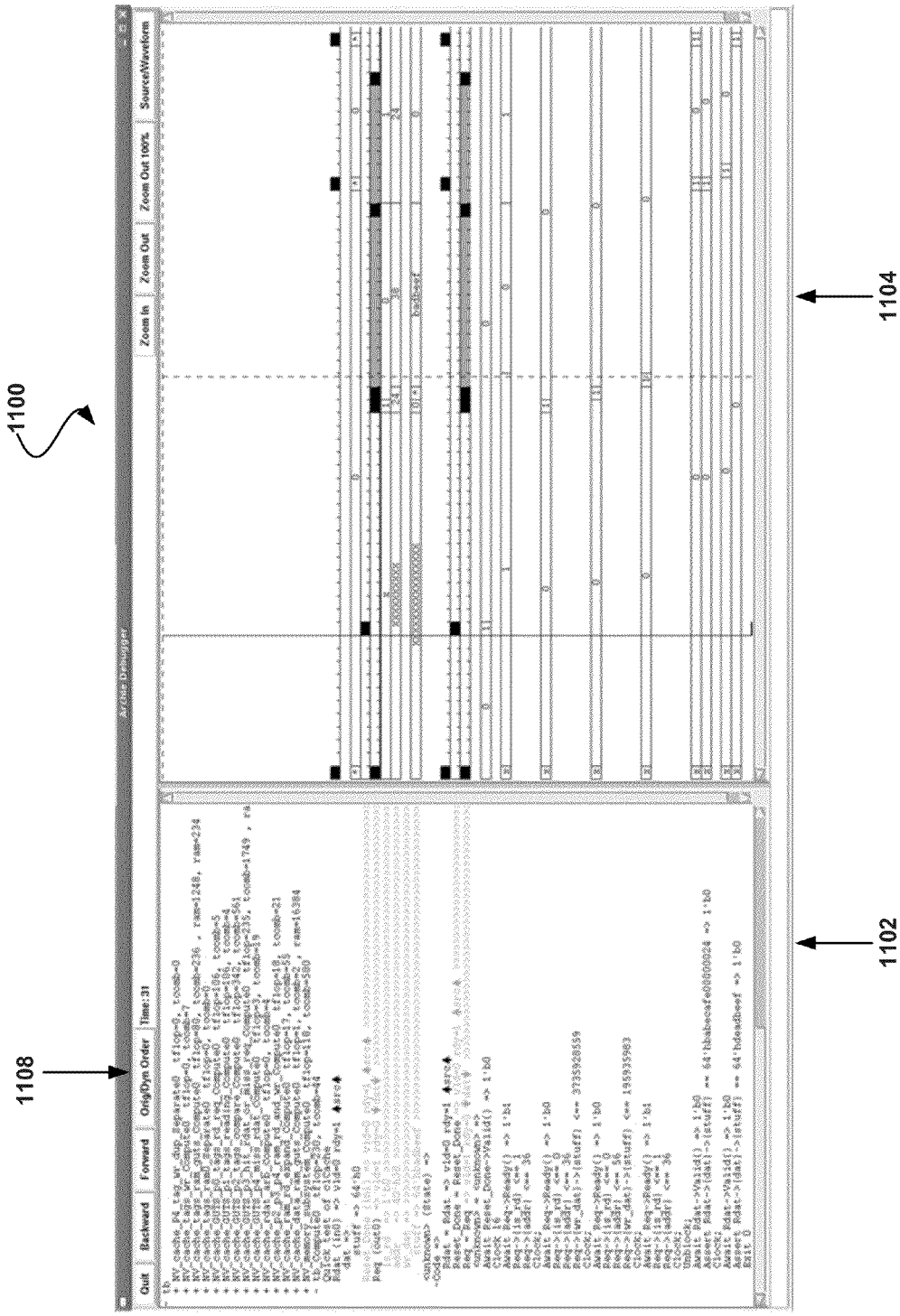
FIG. 11A illustrates an exemplary graphical user interface (GUI) of a debugger having a first portion displaying constructs of a hardware design and a second portion displaying waveforms corresponding to the displayed constructs, in accordance with one embodiment.

FIG. 11A illustrates an exemplary GUI 1100 of a debugger having a first portion displaying constructs of a hardware design and a second portion displaying waveforms corresponding to the displayed constructs, in accordance with one embodiment. As shown, the first portion of the GUI 1100 may be a left window pane 1102 of the GUI in which a list of constructs is displayed in accordance with the methods described above with reference to FIGS. 5-10 above. The second portion of the GUI 1100 may be a right window pane 1104 of the GUI 1100 in which waveforms corresponding to the displayed constructs (i.e. and representing multiple cycles) are displayed.

The left construct pane 1102 shows all constructs along with the original names provided by the user. When the user expands one of the displayed constructs, it opens up and displays information associated with that construct, such as input iflows, output iflows, a condensed digest of the code, as described above with reference to FIG. 9. The input and output iflows are generally hierarchical and displayed as such in the construct pane.

The waveforms for all of these flows and subflows are also displayed in the right waveform pane 1104. Because clocks, valid, and ready signals are implicit, the debugger can easily identify which input/output iflow cycles are valid and ready, valid and not ready, and not valid. The debugger can thus color-code the values in both the left and right panes (1102, 1104) based on this knowledge: valid and ready cycles may be shown in green, valid and not ready stalled cycles may be shown in blue, and not valid (i.e. irrelevant) cycles may be shown in gray. In the waveform pane 1104, the clock, valid, and ready signals for each iflow are shown on one combined line using a solid colored (e.g. green or blue) rectangle with small colored (e.g. yellow) tick marks representing clock posedges. This saves space and provides clarity.

State variables are similarly displayed. The debugger GUI 1100 also shows all state of RAMs when the RAM is expanded. This information may not be saved in the signal dump, but the debugger can play back all the writes to the ram in order to reconstruct its contents.

Because the debugger has knowledge of the out_fifo, out_rdy_reg, and out_reg options for each output iflow, it can display the contents of these structures in a similar way as the RAM contents are displayed. The fifo is mostly its ram contents, but the debugger may show the contents of the fifo in fifo order. State flops may be displayed similarly to iflows.

In all of the cases described above, the debugger displays the original scripting language variable names wherever possible. These names are saved during the capture of the source database.

With respect to the debugger GUI's 1100 display of a code block, in the left construct pane 1102 the debugger decompiles the hardware graph nodes into a succinct list of source code with all comments stripped out and with minimum indentation. This allows much more source code to be displayed for the code block than what would be possible if it were to display the original source code.

This code display allows the current values of the code expressions to be shown in the left pane. Complex expressions can be expanded by clicking on the '+' next to the source line and this will cause it to be expanded to include a separate line for each sub-expression.

Further, because the hm_enable is recorded for each expression and statement, the debugger can highlight with color which statements are enabled (i.e., active) this cycle and which disabled. Enabled statements and expressions may be highlighted using multiple colors. Non-enabled statements (correlated with the X's in the waveform) may be colored in red. These values may also be shown in the right waveform viewer 1104 using the same color scheme, to allow a user to see the values of enabled expressions and statements even over a period of time.

For an input iflow, there is a "src" icon button that the user may click on to get to the producing construct, which has this iflow as an output iflow. In order to show as much useful information on the screen as possible, the debugger may automatically by default move the source construct to just above the original construct in the left pane 1102 and in the waveform pane 1104. There is a button 1108 to toggle the enabling of this dynamic reordering of constructs and to return to the original construct order, which was the order in which the constructs were created in the design.

Similarly, for an output iflow, there is a "dst" icon button that the user may click on to get to the consuming construct, which has this output iflow as an input iflow. And the debugger by default moves the destination construct to just after the original construct.

Assertions, which are code block statements, are identified in the displayed code and waveforms. For cycles where the assertion has fired, the code text and waveform are colored (e.g. hot pink). Printfs are code block statements, and the formatted text is thus shown in both the left construct pane 1102 and in the right waveform pane 1104. Printfs also show up in the simulation stdout file.

It should be noted that the debugger can also be used without a dump in order to only browse the design constructs.

It can be used on either the source database or the hardware model database in this regard. In this case (not shown in FIG. 11A), the right pane always shows the original source code and the values shown in the left pane are replaced with the bitwidths of the leaf flows.

Figure 11B:
FIG. 11B illustrates an exemplary graphical user interface (GUI) of a debugger having a first portion displaying constructs of a hardware design and a second portion displaying source code corresponding to the displayed constructs, in accordance with one embodiment.

FIG. 11B illustrates an exemplary GUI 1150 of a debugger having a first portion displaying constructs of a hardware design and a second portion displaying source code corresponding to the displayed constructs, in accordance with one embodiment. Similarly as shown in FIG. 11A, the debugger GUI 1150 displays two window panes. In FIG. 11A, the left pane 1102 lists the constructs, and further the right pane 1104 shows the waveforms. However, the right pane can also toggle from the display of the waveforms to show the original user's source code corresponding to the construct in the left pane, as shown in 1106 FIG. 11B.

For example, if the user desires to look at his original source code with all the comments, the user may select a button 1110 on the debugger GUI to toggle from the waveform viewer into source code viewing mode. This will display the original source code of the current construct. There are also buttons (1112, 1114) for traversing up and down the scripting language call stack, since the call stack is stored for each constructed node. The toggle button can be pressed again to return to the display of the waveforms.

Figure 12:
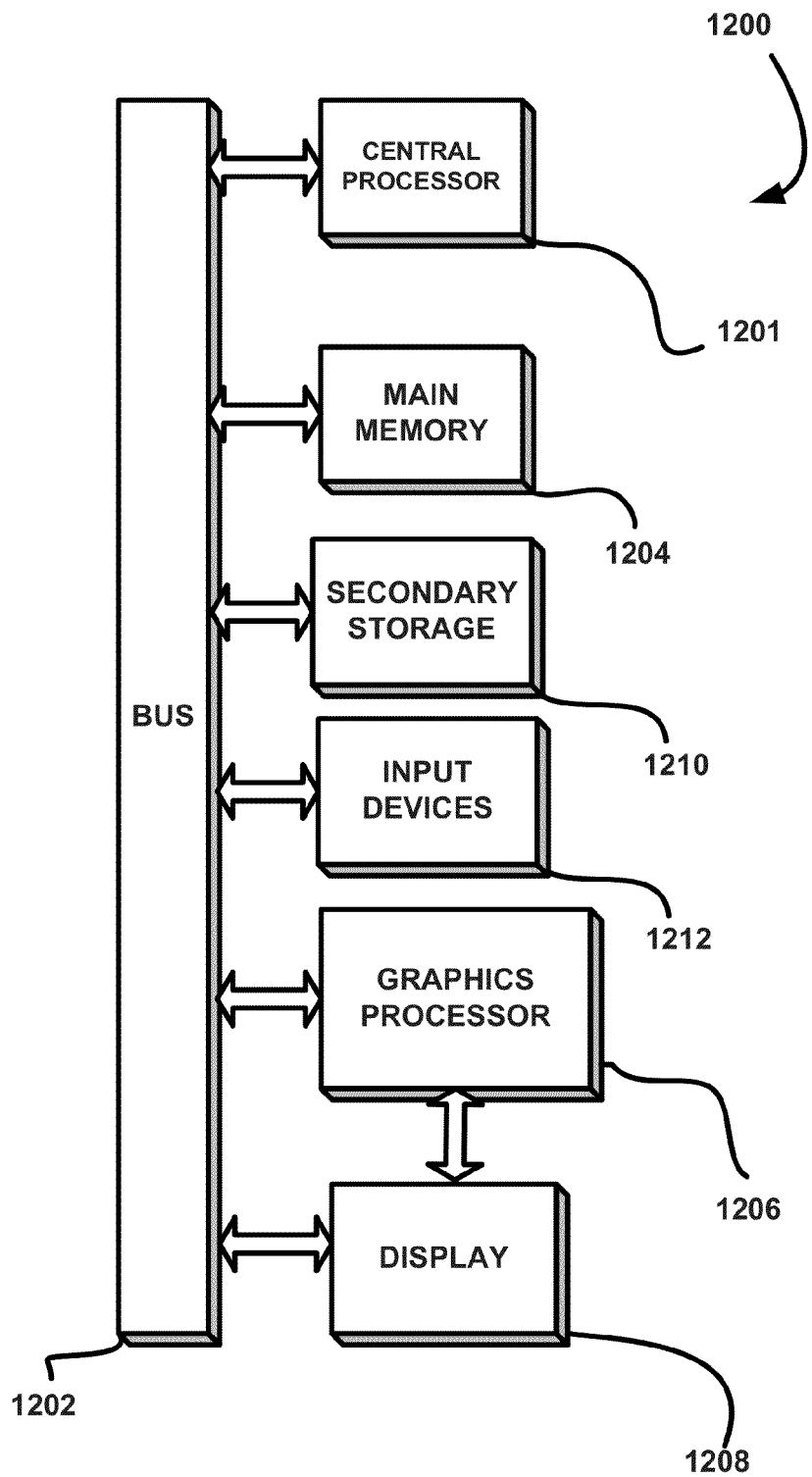
FIG. 12 illustrates an exemplary system in which the various architecture and/or functionality of the various previous embodiments may be implemented.

FIG. 12 illustrates an exemplary system 1200 in which the various architecture and/or functionality of the various previous embodiments may be implemented. As shown, a system 1200 is provided including at least one host processor 1201 which is connected to a communication bus 1202. The communication bus 1202 may be implemented using any suitable protocol, such as PCI (Peripheral Component Interconnect), PCI-Express, AGP (Accelerated Graphics Port), HyperTransport, or any other bus or point-to-point communication protocol(s). The system 1200 also includes a main memory 1204. Control logic (software) and data are stored in the main memory 1204 which may take the form of random access memory (RAM).

The system 1200 also includes input devices 1212, a graphics processor 1206 and a display 1208, i.e. a conventional CRT (cathode ray tube), LCD (liquid crystal display), LED (light emitting diode), plasma display or the like. User input may be received from the input devices 1212, e.g., keyboard, mouse, touchpad, microphone, and the like. In one embodiment, the graphics processor 1206 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user. The system may also be realized by reconfigurable logic which may include (but is not restricted to) field programmable gate arrays (FPGAs).

The system 1200 may also include a secondary storage 1210. The secondary storage 1210 includes, for example, a hard disk drive and/or a removable storage drive, representing a floppy disk drive, a magnetic tape drive, a compact disk drive, digital versatile disk (DVD) drive, recording device, universal serial bus (USB) flash memory, etc. The removable storage drive reads from and/or writes to a removable storage unit in a well-known manner.

Computer programs, or computer control logic algorithms, may be stored in the main memory 1204 and/or the secondary storage 1210. Such computer programs, when executed, enable the system 1200 to perform various functions. Memory 1204, storage 1210 and/or any other storage are possible examples of computer-readable media.

In one embodiment, the architecture and/or functionality of the various previous figures may be implemented in the context of the host processor 1201, graphics processor 1206, an integrated circuit (not shown) that is capable of at least a portion of the capabilities of both the host processor 1201 and the graphics processor 1206, a chipset (i.e. a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 1200 may take the form of a desktop computer, laptop computer, server, workstation, game consoles, embedded system, and/or any other type of logic. Still yet, the system 1200 may take the form of various other devices m including, but not limited to a personal digital assistant (PDA) device, a mobile phone device, a television, etc.

Further, while not shown, the system 1200 may be coupled to a network [e.g. a telecommunications network, local area network (LAN), wireless network, wide area network (WAN) such as the Internet, peer-to-peer network, cable network, etc.) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A computer program product embodied on a non-transitory computer readable medium, comprising:
   code for identifying a hardware model database which stores a graph-based common representation of a hardware design, wherein the graph-based representation includes hardware module nodes each representative of a unique module of the hardware design and associated with one or more instances of the unique module;
   code for identifying a signal dump resulting from a simulation of a logic code model of the hardware design;
   code for identifying each instance of each unique module using the hardware model database, and for each assertion condition included therein, determining a corresponding value for the assertion condition from the signal dump; and
   code for conditionally displaying, by a debugger application, a construct of the hardware design corresponding to each instance of each unique module, based on the determined values of the corresponding assertion conditions included in the instance of the unique module.

2. The computer program product of claim 1, wherein the hardware design comprises an integrated circuit design.

3. The computer program product of claim 1, wherein the logic code model of the hardware design is represented in Verilog®.

4. The computer program product of claim 1, wherein the logic code model of the hardware design is represented in C++.

5. The computer program product of claim 1, wherein for each assertion condition, it is determined during the simulation whether the assertion condition occurs.

6. The computer program product of claim 5, wherein the value for the assertion condition indicates whether the assertion condition occurred during the simulation.

7. The computer program product of claim 1, wherein the hardware model of the database is generated from a source database having a graph-based intermediate representation of the hardware design, and wherein the source database is generated from a hardware language encoding of each construct of the hardware design input by a user.

8. The computer program product of claim 1, wherein each instance of each unique module is identified from a list of instances contained in the unique module of the hardware design.

9. The computer program product of claim 1, wherein a construct of the hardware design corresponding to an instance of a unique module is displayed when a determined value for an assertion condition included in the instance indicates that the assertion condition was met during the simulation.

10. The computer program product of claim 1, further comprising:
   code for receiving a user request to expand a displayed construct; and
   code for, in response to the user request, identifying for display at least one of:
      assertion conditions of the construct that have been met, wherein the assertion conditions that have been met are identified from the signal dump, and
      subconstructs of the construct, wherein the subconstructs are identified from a list within the construct.

11. The computer program product of claim 10, further comprising:
   code for, in response to the user request, identifying for display:
      valid fifo contents, wherein the valid fifo contents are identified by reading a fifo generator RAM and bypass flops in the fifo, and
      RAM contents, wherein the RAM contents are identified from all related writes in the signal dump when the signal dump is a full dump, and wherein the RAM contents are identified from all related writes and reads in the signal dump when the signal dump is a partial dump.

12. The computer program product of claim 1, further comprising code for drawing a code digest for a displayed construct, including code for:
   traversing nodes in a code block of the construct to identify each statement in the code block;
   determining whether each of the identified statements is enabled or disabled;
   displaying each of the identified statements with an indicator of whether the statement is enabled or disabled;
   retrieving signal values from the signal dump for each code node expression; and
   displaying the signal values.

13. The computer program product of claim 1, wherein each construct that is displayed is displayed in a graphical user interface (GUI) of a debugger.

14. The computer program product of claim 1, further comprising code for determining values for each displayed construct from the signal dump for display thereof.

15. The computer program product of claim 14, wherein the values are determined from the signal dump for a root flow of the node.

16. The computer program product of claim 15, wherein the root flow of the node is determined by:
   identifying as a source node an original construct to be displayed;
   identifying a full signal dump path to an instance of a unique module that holds the source node;
   determining whether the source node is a root flow;
   if the source node is not the root flow, following a parent link of the source node, and repeating the following of the parent link for each encountered node that is not the root flow, until the root flow is encountered; and
   if the source node is the root flow or when the root flow is encountered, determining values for the root flow from the signal dump.

17. The computer program product of claim 16, wherein a bitrange of the root flow is previously set or is calculated during traversal from the source node to the root flow.

18. The computer program product of claim 1, further comprising code for receiving a user selection associated with a particular construct of one of: a source option associated with the particular construct to go to a source of the particular construct, and a destination option associated with the particular construct to go to a destination of the particular construct.

19. The computer program product of claim 18, further comprising:
   code for determining a new construct that is the source of the particular construct and displaying in a list of constructs the new construct prior to the particular construct, when the user selection is of the source option; and
   code for determining a new construct that is the destination of the particular construct and displaying in a list of constructs the new construct following the particular construct, when the user selection is of the destination option.

20. A method, comprising:
   identifying, using a computer, a hardware model database which stores a graph-based common representation of a hardware design, wherein the graph-based representation includes hardware module nodes each representative of a unique module of the hardware design and associated with one or more instances of the unique module;
   identifying a signal dump resulting from a simulation of a logic code model of the hardware design;
   identifying each instance of each unique module using the hardware model database, and for each assertion condition included therein, determining a corresponding value for the assertion condition from the signal dump; an
   conditionally displaying, by a debugger application, a construct of the hardware design corresponding to each instance of each unique module, based on the determined values of the corresponding assertion conditions included in the instance of the unique module.

21. A system, comprising:
   a processor for:
      identifying a hardware model database which stores a graph-based common representation of a hardware design, wherein the graph-based representation includes hardware module nodes each representative of a unique module of the hardware design and associated with one or more instances of the unique module;

identifying a signal dump resulting from a simulation of a logic code model of the hardware design;

identifying each instance of each unique module using the hardware model database, and for each assertion condition included therein, determining a corresponding value for the assertion condition from the signal dump; and conditionally displaying, by a debugger application, a construct of the hardware design corresponding to each instance of each unique module, based on the determined values of the corresponding assertion conditions included in the instance of the unique module.

* * * * *